(12) United States Patent
Ojanpera

(10) Patent No.: US 9,224,398 B2
(45) Date of Patent: Dec. 29, 2015

(54) COMPRESSED SAMPLING AUDIO APPARATUS

(75) Inventor: Juha Petteri Ojanpera, Nokia (FI)

(73) Assignee: Nokia Technologies Oy, Espoo (FI)

(*) Notice: Subject to any disclaimer, the term of this patent is extended or adjusted under 35 U.S.C. 154(b) by 233 days.

(21) Appl. No.: 13/807,728

(22) PCT Filed: Jul. 1, 2010

(86) PCT No.: PCT/IB2010/053027
§ 371 (c)(1),
(2), (4) Date: Apr. 15, 2013

(87) PCT Pub. No.: WO2012/001463
PCT Pub. Date: Jan. 5, 2012

(65) Prior Publication Data
US 2013/0204631 A1 Aug. 8, 2013

(51) Int. Cl.
*G10L 19/00* (2013.01)
*G10L 19/008* (2013.01)
*G10L 19/02* (2013.01)
*H03M 7/30* (2006.01)

(52) U.S. Cl.
CPC .............. *G10L 19/00* (2013.01); *G10L 19/008* (2013.01); *G10L 19/0212* (2013.01); *H03M 7/30* (2013.01)

(58) Field of Classification Search
CPC .............. G10L 19/008; G10L 19/0017; G10L 19/0021; G10L 19/0204; G10L 19/038; G10L 19/061; G10L 2019/0001; G10L 2019/0005; G10L 25/18; G10L 19/018; G10L 19/00; H04N 19/60; H03M 7/30
USPC ............... 704/200.1, 500–504, 262; 375/146, 375/147, 240, 260, 240.22, 216; 381/22, 381/23, 119; 341/87
See application file for complete search history.

(56) References Cited

U.S. PATENT DOCUMENTS

| | | | | |
|---|---|---|---|---|
| 5,687,191 A * | 11/1997 | Lee et al. | ................. | 375/216 |
| 5,987,407 A * | 11/1999 | Wu et al. | ................. | 704/200.1 |
| 6,006,179 A * | 12/1999 | Wu et al. | ................. | 704/222 |
| 8,553,994 B2 * | 10/2013 | Tian et al. | ................. | 382/232 |
| 2008/0129560 A1 * | 6/2008 | Baraniuk et al. | ................. | 341/87 |
| 2008/0270801 A1 * | 10/2008 | Levy et al. | ................. | 713/179 |
| 2008/0300025 A1 * | 12/2008 | Song et al. | ................. | 455/569.1 |
| 2009/0060362 A1 * | 3/2009 | Harmanci et al. | ............. | 382/238 |

(Continued)

OTHER PUBLICATIONS

International Search Report and Written Opinion for Application No. PCT/IB2010/053027, dated Mar. 17, 2011.

(Continued)

*Primary Examiner* — Vijay B Chawan
(74) *Attorney, Agent, or Firm* — Alston & Bird LLP

(57) ABSTRACT

Apparatus comprising at least one processor and at least one memory including computer code, the at least one memory and the computer code configured to with the at least one processor cause the apparatus to at least perform: transforming an audio signal into a sparse domain signal, the sparse domain signal representing the audio signal; transforming the sparse domain signal into a measurement domain signal; determining a sampling pattern dependent on the measurement domain signal; and measuring the measurement domain signal dependent on the sampling pattern.

34 Claims, 16 Drawing Sheets

(56) References Cited

U.S. PATENT DOCUMENTS

2009/0068951 A1    3/2009  Mishali et al.
2009/0187409 A1*   7/2009  Krishnan et al. .............. 704/262
2009/0196513 A1*   8/2009  Tian et al. ..................... 382/232
2010/0296672 A1*  11/2010  Vickers ......................... 381/119
2013/0114733 A1*   5/2013  Fukui et al. .............. 375/240.22

OTHER PUBLICATIONS

Epain, N. et al., The Application of Compressive Sampling to the Analysis and Synthesis of Spatial Sound Fields, AES Convention 127 (2009) 12 pages.

Wan, T., et al., Compressive Image Fusion, IEEE (2008) pp. 1308-1311.

* cited by examiner

COMPRESSED SAMPLING AUDIO APPARATUS

FIELD OF THE APPLICATION

The present invention relates to apparatus for the processing of audio signals using compressed sampling. The invention further relates to, but is not limited to, apparatus for processing audio signals using compressed sampling in mobile devices.

BACKGROUND OF THE APPLICATION

Audio scene capture and rendering is a developing technical field. In audio scene capture multiple spaced microphones are used to capture audio signals which are compressed prior to being transmitted to rendering systems. Audio scene rendering is where the audio signal is decompressed and processed to render the audio such that the user of the audio rendering system can produce a customised aural "view point". However to enable selection flexibility the capture and compression of the audio scene into a suitable format typically requires a significant amount of data to be passed across the network (or to be stored to be used at a later date), as multiple microphone configurations are captured in order to produce significantly detailed recordings. This produces bandwidth requirements on the network/storage system, or requires significant encoding efficiency to reduce the requirements.

Typical Nyquist sampling of each microphone audio signals to represent the captured audio signals requires a large number of samples and associated data which is then compressed using a suitable encoding algorithm in order to reduce the bandwidth required on the network or storage device.

Compressed or compressive sensing (CS) is an emerging and promising technology which has been shown to be useful in compressing image data more efficiently or effectively than conventional Cosine or Wavelet compression algorithms have achieved. Compressed sensing is attractive for compression purposes due to its relative lack of complexity at the capture side. Compressed sensing seeks to represent a signal using a number of linear, non-adaptive measurements. Typically the number of measurements is fewer than the number of samples needed where the signal is sampled at the Nyquist rate, thus providing the benefits of reduced storage space and transmission bandwidth encoding or compression. Compressed sensing requires that the signal is very sparse in some basis. In order words that the audio signals are a linear combination of a small number of basis functions. Where the audio signal is very sparse it is possible to correctly reconstruct the original signal despite the original signal not being sampled at the Nyquist rate. However the compressed or compressive sensing measurements made are usually not dependent on the basis used in reconstruction and thus the measurement process is universal as it does not need to change as different types of signals are captured.

However application of compressed sensing to audio signals is typically problematic in that audio signals are not truly sparse by nature. As such it has been difficult to apply compressed sensing to audio signals at compression ratios which produce good levels of compression with good levels of quality of reconstructed signal.

SUMMARY OF SOME EMBODIMENTS

Embodiments of the present invention attempt to take compressive or compressed sensing measurements of an audio signal which have non-sparse characteristics by default yet produce more efficient compression ratios whilst still providing good quality.

There is provided according to the invention apparatus comprising at least one processor and at least one memory including computer code, the at least one memory and the computer code configured to with the at least one processor cause the apparatus to at least perform: transforming an audio signal into a sparse domain signal, the sparse domain signal representing the audio signal; transforming the sparse domain signal into a measurement domain signal; determining a sampling pattern dependent on the measurement domain signal; and measuring the measurement domain signal dependent on the sampling pattern.

Transforming the audio signal into a sparse domain signal may further cause the apparatus to perform at least one of: modified discrete cosine transforming the audio signal; and discrete wavelet transforming the audio signal.

Transforming the sparse domain signal into a measurement domain signal may further cause the apparatus to perform: a first transformation; and a further transformation.

First transformation may cause the apparatus to perform at least one of: discrete cosine transforming the sparse domain signal; discrete sine transforming the sparse domain signal; and Karhunen-Loeve transforming the sparse domain signal.

The audio signal may comprise at least two channel audio signals, the sparse domain signal may comprise at least two channel sparse domain signals each representing an associated channel audio signal, wherein transforming the first sparse domain signal into a first measurement domain signal may further cause the apparatus to perform: aligning each channel sparse domain signal to form a three dimensional sparse domain signal; and three dimensional transforming of the three dimensional sparse domain signal.

Further transformation may cause the apparatus to perform fourier transforming on the first transformation.

Fourier transforming on the first transformation may cause the apparatus to perform two dimensional transforming on each channel of the first transformation.

Determining a sampling pattern dependent on the measurement domain signal may cause the apparatus to perform: determining a main lobe sampling pattern; determining a side lobe sampling pattern; determining a vertical sampling bar sampling pattern; determining a star sampling pattern; and combining the main lobe sampling pattern, the side lobe sampling pattern, the vertical sampling bar sampling pattern, and the star sampling pattern.

Determining the main lobe sampling pattern may cause the apparatus to perform determining a main lobe width, wherein the main lobe width is the width of one dimension of the measurement domain signal within which an average of signal energy envelope for the width is greater than a predefined value.

Determining the vertical sampling bar sampling pattern may cause the apparatus to perform determining a first bar sampling first dimension value adjacent to the main lobe width value; and determining further bar sampling first dimension values by incrementing the first bar sampling first dimension value by a predefined function value.

The predefined function value may be an exponential function.

Determining the side lobe sampling pattern may cause the apparatus to perform determining the width of one dimension of the measurement domain signal within which the signal energy envelope is greater than a second predefined value for at least one further dimension value of the measurement domain signal.

Determining the star sampling pattern may cause the apparatus to perform: determining a plurality of radial sampling patterns; and extracting a sub-part of the radial sampling patterns.

The apparatus may be further caused to perform at least one of: storing the sampling pattern and measured measurement domain signal; and transmitting the sampling pattern and measured measurement domain signal.

According to a second aspect of the invention there is provided an apparatus comprising at least one processor and at least one memory including computer code, the at least one memory and the computer code configured to with the at least one processor cause the apparatus to at least perform: determining a measurement domain signal dependent on a sampling pattern and a measured measurement domain signal; transforming the measurement domain signal into a sparse domain signal; transforming the sparse domain signal into an audio signal.

Transforming the sparse domain signal into an audio signal further may cause the apparatus to perform at least one of: inverse modified discrete cosine transforming the audio signal; and inverse discrete wavelet transforming the audio signal.

Transforming the measurement domain signal into the sparse domain signal may further cause the apparatus to perform: a first transformation; and a further transformation.

The further transformation may cause the apparatus to perform at least one of: inverse discrete cosine transforming the first transformation; inverse discrete sine transforming the first transformation; and inverse Karhunen-Loeve transforming the first transformation.

The first transformation may cause the apparatus to perform fourier transforming on the measurement domain signal.

Fourier transforming on the first transformation may cause the apparatus to perform two dimensional transforming on each channel of the measurement domain signal.

The apparatus may be further caused to perform: determining a main lobe sampling pattern; determining a side lobe sampling pattern; determining a vertical sampling bar sampling pattern; determining a star sampling pattern; and combining the main lobe sampling pattern, the side lobe sampling pattern, the vertical sampling bar sampling pattern, and the star sampling pattern to form the sampling pattern.

Determining the vertical sampling bar sampling pattern may cause the apparatus to perform determining a first bar sampling first dimension value adjacent to a main lobe sampling pattern width value; and determining further bar sampling first dimension values by incrementing the first bar sampling first dimension value by a predefined function value.

The predefined function value may be an exponential function.

Determining the star sampling pattern may cause the apparatus to perform: determining a plurality of radial sampling patterns; and extracting a sub-part of the radial sampling patterns.

The apparatus may be further caused to perform at least one of: reading from a memory the sampling pattern and measured measurement domain signal; and receiving the sampling pattern and measured measurement domain signal.

According to a third aspect of the invention there is provided a method comprising: transforming an audio signal into a sparse domain signal, the sparse domain signal representing the audio signal; transforming the sparse domain signal into a measurement domain signal; determining a sampling pattern dependent on the measurement domain signal; and measuring the measurement domain signal dependent on the sampling pattern.

Transforming the audio signal into a sparse domain signal may comprise at least one of: modified discrete cosine transforming the audio signal; and discrete wavelet transforming the audio signal.

Transforming the sparse domain signal into a measurement domain signal may comprise: a first transformation; and a further transformation.

First transforming may comprise at least one of: discrete cosine transforming the sparse domain signal; discrete sine transforming the sparse domain signal; and Karhunen-Loeve transforming the sparse domain signal.

The audio signal may comprise at least two channel audio signals, the sparse domain signal may comprising at least two channel sparse domain signals each representing an associated channel audio signal, wherein transforming the first sparse domain signal into a first measurement domain signal may comprise: aligning each channel sparse domain signal to form a three dimensional sparse domain signal; and three dimensional transforming of the three dimensional sparse domain signal.

Further transformation may comprise fourier transforming on the first transformation.

Fourier transforming on the first transformation may comprise two dimensional transforming on each channel of the first transformation.

Determining a sampling pattern dependent on the measurement domain signal may comprise: determining a main lobe sampling pattern; determining a side lobe sampling pattern; determining a vertical sampling bar sampling pattern; determining a star sampling pattern; and combining the main lobe sampling pattern, the side lobe sampling pattern, the vertical sampling bar sampling pattern, and the star sampling pattern.

Determining the main lobe sampling pattern may comprise determining a main lobe width, wherein the main lobe width is the width of one dimension of the measurement domain signal within which an average of signal energy envelope for the width is greater than a predefined value.

Determining the vertical sampling bar sampling pattern may comprise determining a first bar sampling first dimension value adjacent to the main lobe width value; and determining further bar sampling first dimension values by incrementing the first bar sampling first dimension value by a predefined function value.

The predefined function value may be an exponential function.

Determining the side lobe sampling pattern may comprise determining the width of one dimension of the measurement domain signal within which the signal energy envelope is greater than a second predefined value for at least one further dimension value of the measurement domain signal.

Determining the star sampling pattern may comprise: determining a plurality of radial sampling patterns; and extracting a sub-part of the radial sampling patterns.

The method may further comprise at least one of: storing the sampling pattern and measured measurement domain signal; and transmitting the sampling pattern and measured measurement domain signal.

According to a fourth aspect of the invention there is provided a method comprising: determining a measurement domain signal dependent on a sampling pattern and a measured measurement domain signal; transforming the measurement domain signal into a sparse domain signal; transforming the sparse domain signal into an audio signal.

Transforming the sparse domain signal into an audio signal may comprise at least one of: inverse modified discrete cosine transforming the audio signal; and inverse discrete wavelet transforming the audio signal.

Transforming the measurement domain signal into the sparse domain signal may comprise: a first transformation; and a further transformation.

The further transformation may comprise at least one of: inverse discrete cosine transforming the first transformation; inverse discrete sine transforming the first transformation; and inverse Karhunen-Loeve transforming the first transformation.

First transformation may comprise fourier transforming on the measurement domain signal.

Fourier transforming on the first transformation may comprise two dimensional transforming on each channel of the measurement domain signal.

The method may further comprise: determining a main lobe sampling pattern; determining a side lobe sampling pattern; determining a vertical sampling bar sampling pattern; determining a star sampling pattern; and combining the main lobe sampling pattern, the side lobe sampling pattern, the vertical sampling bar sampling pattern, and the star sampling pattern to form the sampling pattern.

Determining the vertical sampling bar sampling pattern may comprise determining a first bar sampling first dimension value adjacent to a main lobe sampling pattern width value; and determining further bar sampling first dimension values by incrementing the first bar sampling first dimension value by a predefined function value.

The predefined function value may be an exponential function.

Determining the star sampling pattern may comprise: determining a plurality of radial sampling patterns; and extracting a sub-part of the radial sampling patterns.

The method may further comprise at least one of: reading from a memory the sampling pattern and measured measurement domain signal; and receiving the sampling pattern and measured measurement domain signal.

According to a fifth aspect of the present invention there is provided an apparatus comprising: an audio to sparse domain transformer configured to transform an audio signal into a sparse domain signal, the sparse domain signal representing the audio signal; a sparse domain to measurement domain transformer configured to transform the sparse domain signal into a measurement domain signal; a sampling pattern determiner configured to determine a sampling pattern dependent on the measurement domain signal; and a measurer configured to measure the measurement domain signal dependent on the sampling pattern.

The audio to sparse domain transformer may comprise at least one of: a modified discrete cosine transformer; and a discrete wavelet transformer.

The sparse to measurement domain transformer may comprise: a first transformer; and a further transformer.

The first transformer may comprise at least one of: a discrete cosine transformer; a discrete sine transformer; and a Karhunen-Loeve transformer.

The audio signal may comprise at least two channel audio signals, the sparse domain signal may comprise at least two channel sparse domain signals each representing an associated channel audio signal, wherein the sparse to measurement domain transformer may comprise: an aligner configured to align each channel sparse domain signal to form a three dimensional sparse domain signal; and a three dimensional transformer configured to perform a three dimensional transform of the three dimensional sparse domain signal.

The further transformer may comprise a fourier transformer configured to perform a fourier transform on the first transformation.

The fourier transformer may comprise at least one two dimensional fourier transformer.

The sampling pattern determiner may comprise: a main lobe determiner configured to determine a main lobe sampling pattern; a side lobe determiner configured to determine a side lobe sampling pattern; a vertical sampling bar pattern determiner configured to determine a vertical sampling bar sampling pattern; a star sampling pattern determiner configured to determine a star sampling pattern; and a pattern combiner configured to combine the main lobe sampling pattern, the side lobe sampling pattern, the vertical sampling bar sampling pattern, and the star sampling pattern.

The main lobe determiner may comprise main lobe width determiner configured to determine a main lobe width as the width of one dimension of the measurement domain signal within which an average of signal energy envelope for the width is greater than a predefined value.

The vertical sampling bar pattern determiner may comprise: a first bar determiner configured to determine a first bar sampling first dimension value adjacent to the main lobe width value; and a further bar determiner configured to determine further bar sampling first dimension values by incrementing the first bar sampling first dimension value by a predefined function value.

The predefined function value may be an exponential function.

The side bar determiner may comprise a side bar width determiner configured to determine the width of one dimension of the measurement domain signal within which the signal energy envelope is greater than a second predefined value for at least one further dimension value of the measurement domain signal.

The star pattern determiner may comprise: a radial pattern determiner configured to determine a plurality of radial sampling patterns; and a pattern extractor configured to extract a sub-part of the radial sampling patterns.

The apparatus may comprise memory configured to store the sampling pattern and measured measurement domain signal.

The apparatus may comprise a transmitter configured to transmit the sampling pattern and measured measurement domain signal.

According to a sixth aspect of the invention there is provided an apparatus comprising: an measurement domain reconstructor configured to determine a measurement domain signal dependent on a sampling pattern and a measured measurement domain signal; a measurement to sparse domain transformer configured to transform the measurement domain signal into a sparse domain signal; and a sparse to audio domain transformer configured to transform the sparse domain signal into an audio signal.

The sparse to an audio domain transformer may comprise at least one of: an inverse modified discrete cosine transformer; and an inverse discrete wavelet transformer.

The measurement to sparse domain transformer may comprise: a first transformer; and a further transformer.

The further transformer may comprise at least one of: an inverse discrete cosine transformer configured to transform the first transformer output; an inverse discrete sine transformer configured to transform the first transformer output; and an inverse Karhunen-Loeve transformer configured to transform the first transformer output.

The first transformer may comprise a fourier transformer configured to perform fourier transforming on the measurement domain signal.

The fourier transformer can comprise a two dimensional transformer configured to perform transforming on each channel of the measurement domain signal.

The apparatus may further comprise: a main lobe determiner configured to determine a main lobe sampling pattern; a side lobe determiner configured to determine a side lobe sampling pattern; a vertical sampling bar pattern determiner configured to determine a vertical sampling bar sampling pattern; a star pattern determiner configured to determine a star sampling pattern; and a pattern combiner configured to combine the main lobe sampling pattern, the side lobe sampling pattern, the vertical sampling bar sampling pattern, and the star sampling pattern to form the sampling pattern.

The vertical sampling bar pattern determiner may comprise: a first bar determiner configured to determine a first bar sampling first dimension value adjacent to a main lobe sampling pattern width value; and a further bar determiner configured to determine further bar sampling first dimension values by incrementing the first bar sampling first dimension value by a predefined function value.

The predefined function value may be an exponential function.

The star pattern determiner may comprise: a radial pattern determiner configured to determine a plurality of radial sampling patterns; and a pattern extractor configured to extract a sub-part of the radial sampling patterns.

The apparatus may comprise a memory configured to store the sampling pattern and measured measurement domain signal.

The apparatus may comprise a receiver configured to receive the sampling pattern and measured measurement domain signal.

According to a seventh aspect of the invention there is provided an apparatus comprising: first transforming means configured to transform an audio signal into a sparse domain signal, the sparse domain signal representing the audio signal; second transforming means configured to transform the sparse domain signal into a measurement domain signal; processing means configured to determine a sampling pattern dependent on the measurement domain signal; and measuring means configured to measure the measurement domain signal dependent on the sampling pattern.

The first transforming means may comprise at least one of: a modified discrete cosine transformer; and a discrete wavelet transformer.

The second transforming means may comprise: a first transformer; and a further transformer.

The first transformer may comprise at least one of: a discrete cosine transformer; a discrete sine transformer; and a Karhunen-Loeve transformer.

The audio signal may comprise at least two channel audio signals, the sparse domain signal may comprise at least two channel sparse domain signals each representing an associated channel audio signal, wherein the second transforming means may comprise: an aligner configured to align each channel sparse domain signal to form a three dimensional sparse domain signal; and a three dimensional transformer configured to perform a three dimensional transform of the three dimensional sparse domain signal.

The further transformer may comprise a fourier transformer configured to perform a fourier transform on the first transformation.

The fourier transformer may comprise at least one two dimensional fourier transformer.

The processing means may comprise: a main lobe determiner configured to determine a main lobe sampling pattern; a side lobe determiner configured to determine a side lobe sampling pattern; a vertical sampling bar pattern determiner configured to determine a vertical sampling bar sampling pattern; a star sampling pattern determiner configured to determine a star sampling pattern; and a pattern combiner configured to combine the main lobe sampling pattern, the side lobe sampling pattern, the vertical sampling bar sampling pattern, and the star sampling pattern.

The main lobe determiner may comprise main lobe width determiner configured to determine a main lobe width as the width of one dimension of the measurement domain signal within which an average of signal energy envelope for the width is greater than a predefined value.

The vertical sampling bar pattern determiner may comprise: a first bar determiner configured to determine a first bar sampling first dimension value adjacent to the main lobe width value; and a further bar determiner configured to determine further bar sampling first dimension values by incrementing the first bar sampling first dimension value by a predefined function value.

The predefined function value may be an exponential function.

The side bar determiner may comprise a side bar width determiner configured to determine the width of one dimension of the measurement domain signal within which the signal energy envelope is greater than a second predefined value for at least one further dimension value of the measurement domain signal.

The star pattern determiner may comprise: a radial pattern determiner configured to determine a plurality of radial sampling patterns; and a pattern extractor configured to extract a sub-part of the radial sampling patterns.

The apparatus may comprise storage means configured to store the sampling pattern and measured measurement domain signal.

The apparatus may comprise transmitting means configured to transmit the sampling pattern and measured measurement domain signal.

According to an eighth aspect of the invention there is provided an apparatus comprising: reconstructor means configured to determine a measurement domain signal dependent on a sampling pattern and a measured measurement domain signal; first transforming means configured to transform the measurement domain signal into a sparse domain signal; and second transforming means configured to transform the sparse domain signal into an audio signal.

The second transforming means may comprise at least one of: an inverse modified discrete cosine transformer; and an inverse discrete wavelet transformer.

The measurement to sparse domain transformer may comprise: a first transformer; and a further transformer.

The further transformer may comprise at least one of: an inverse discrete cosine transformer configured to transform the first transformer output; an inverse discrete sine transformer configured to transform the first transformer output; and an inverse Karhunen-Loeve transformer configured to transform the first transformer output.

The first transformer may comprise a fourier transformer configured to perform fourier transforming on the measurement domain signal.

The fourier transformer can comprise a two dimensional transformer configured to perform transforming on each channel of the measurement domain signal.

The apparatus may further comprise: a main lobe determiner configured to determine a main lobe sampling pattern;

a side lobe determiner configured to determine a side lobe sampling pattern; a vertical sampling bar pattern determiner configured to determine a vertical sampling bar sampling pattern; a star pattern determiner configured to determine a star sampling pattern; and a pattern combiner configured to combine the main lobe sampling pattern, the side lobe sampling pattern, the vertical sampling bar sampling pattern, and the star sampling pattern to form the sampling pattern.

The vertical sampling bar pattern determiner may comprise: a first bar determiner configured to determine a first bar sampling first dimension value adjacent to a main lobe sampling pattern width value; and a further bar determiner configured to determine further bar sampling first dimension values by incrementing the first bar sampling first dimension value by a predefined function value.

The predefined function value may be an exponential function.

The star pattern determiner may comprise: a radial pattern determiner configured to determine a plurality of radial sampling patterns; and a pattern extractor configured to extract a sub-part of the radial sampling patterns.

The apparatus may comprise storage means configured to store the sampling pattern and measured measurement domain signal.

The apparatus may comprise receiver means configured to receive the sampling pattern and measured measurement domain signal.

An electronic device may comprise apparatus as described above.

A chipset may comprise apparatus as described above.

Embodiments of the present invention aim to address the above problems.

BRIEF DESCRIPTION OF DRAWINGS

For better understanding of the present application, reference will now be made by way of example to the accompanying drawings in which.

SOME EMBODIMENTS OF THE APPLICATION

The following describes in further detail suitable apparatus and possible mechanisms for the provision of compressed or compressive sampling of an audio signal for at least one audio channel.

Figure 1:
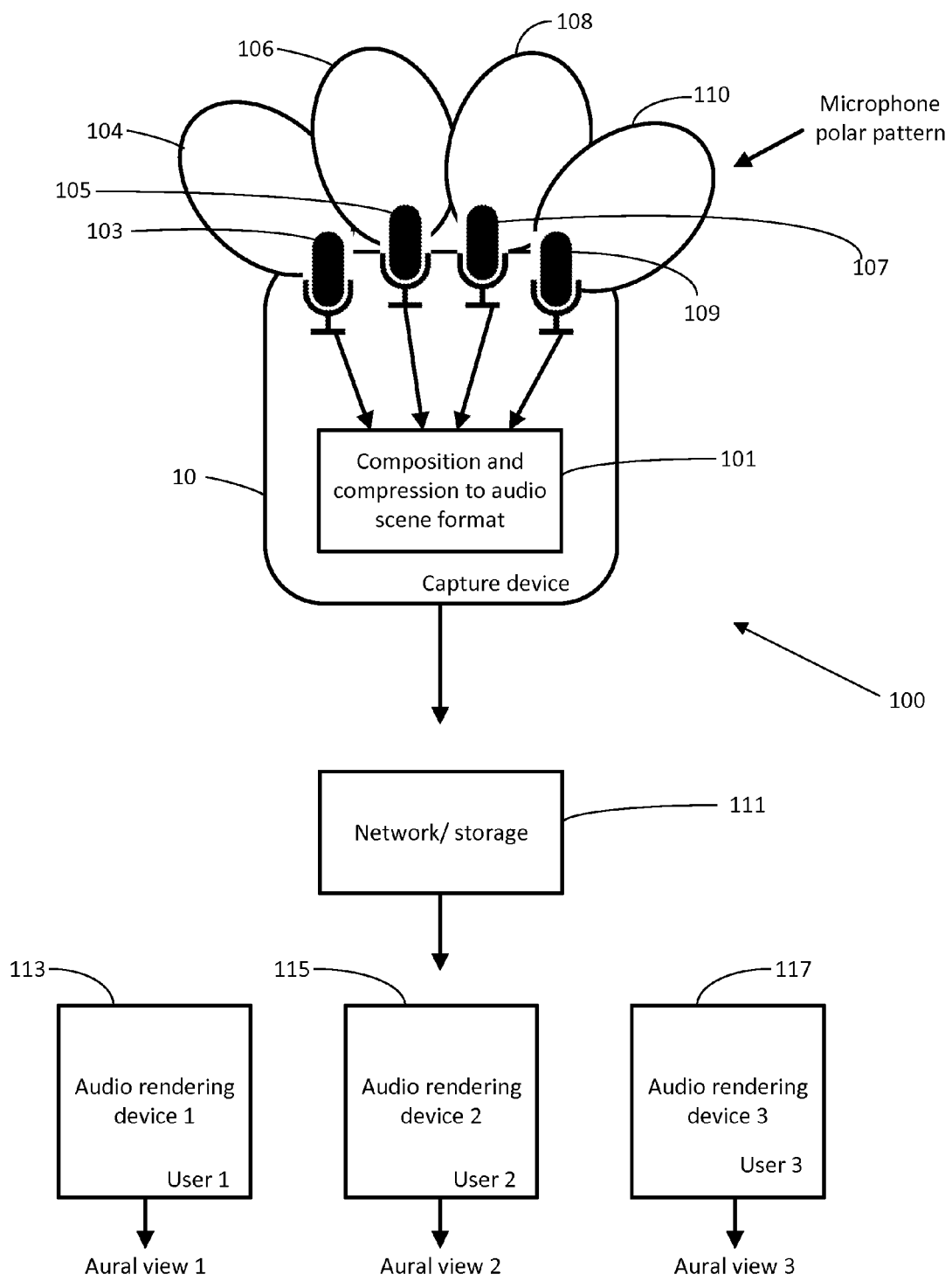
FIG. 1 shows schematically a multi-user free-viewpoint sharing services system which may encompass some embodiments of the application.

With respect to FIG. 1 a typical audio scene audio capture and rendering system is schematically shown which could implement some embodiments of the application. The audio scene audio capture and rendering system 100 in some embodiments comprises an audio capture device 10. The audio capture device 10 can in some embodiments comprise a series of microphones which are spaced and arranged to be configured to capture audio signals from various directions to provide a sufficiently detailed captured audio signal. For example as shown in FIG. 1 the capture device 10 comprises four microphones, a first microphone 103 with a capture profile shown by the beam 104, a second microphone 105 with a capture profile shown by beam 106, a third microphone 107 with an associated capture profile shown by beam 108 and a fourth microphone 109 with an associated capture profile shown by beam 110.

The configuration of the microphones shown in FIG. 1 is purely exemplary and can in other embodiments differ. For example traditional multi-channel configurations such as 4.0, 5.1 or 7.2 channel capture configurations can be implemented. Furthermore in some other embodiments the traditional multi-microphone setup as shown in FIG. 1 can be replaced by multiple microphones placed close to each other on a linear axis or multiple microphones set on a surface of a sphere or hemisphere according to a desired pattern/density. In some further embodiments the microphone configuration can comprise a set of microphones set in a random (but predefined and known) position arrangement.

The audio capture device 10 in some embodiments further comprises a formatter 101, the formatter 101 is configured to receive the audio signals from the microphones 103, 105, 107 and 109 and compress the received signals into a suitable encoded audio format suitable for storage or transmission across the network.

The system 100 in some embodiments further comprises as shown in FIG. 1 a network/storage device 111 configured to either transmit the compressed audio signals received from the capture device to further devices or to store the compressed audio formatted data for later use.

As shown in FIG. 1, of the system in some embodiments comprises at least one audio rendering device 113, 115, 117. A first audio rendering device 113 for example may be used by a first user (user 1) which configures the compressed audio signals received or download via the network/storage, and render the audio signals to produce a first aural view. Similarly FIG. 1 shows a second audio rendering device 115 used by a second user (user 2) to generate a second aural view and a third audio rendering device 117 used by a third user (user 3) to generate a third aural view.

Figure 2:
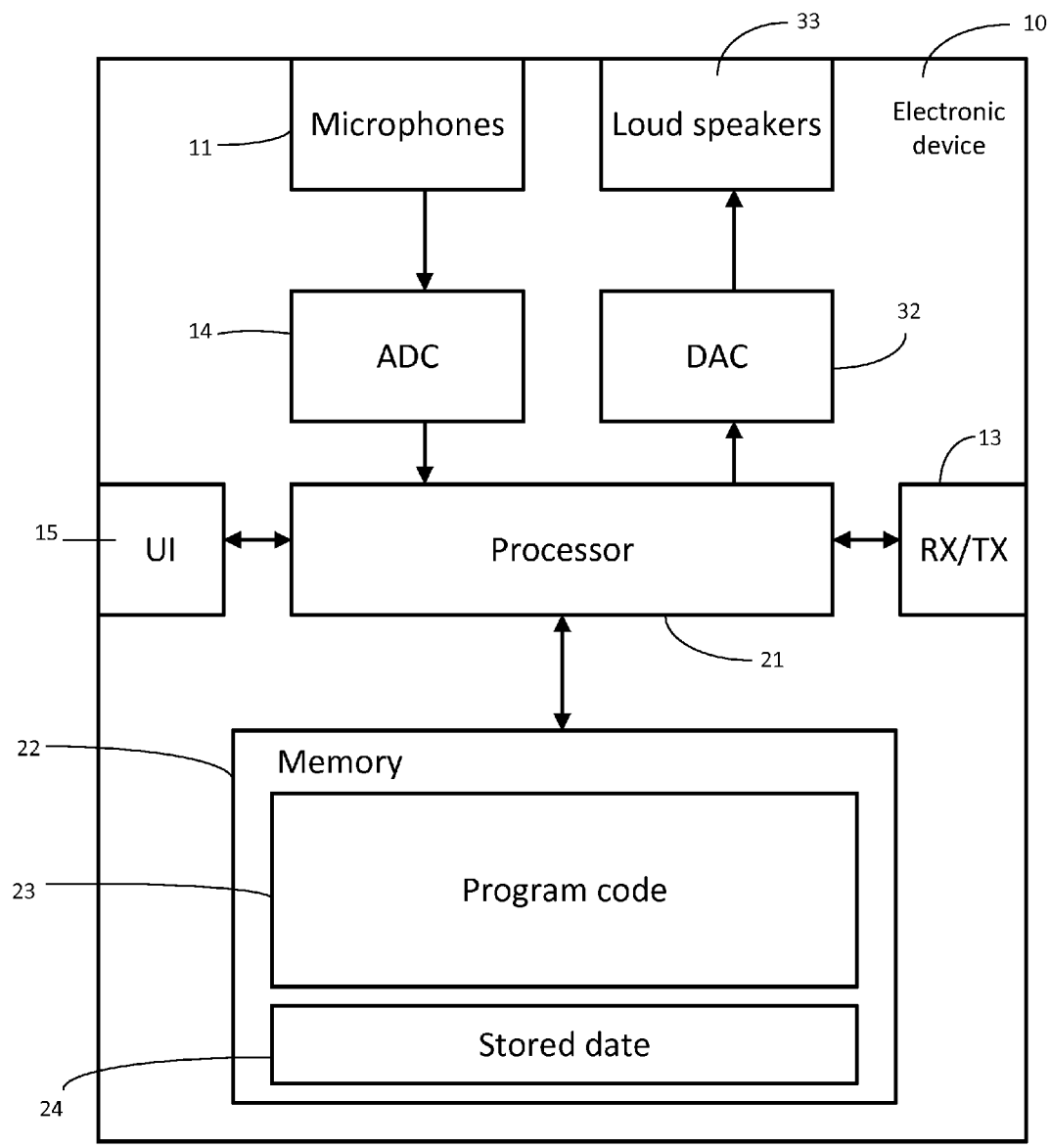
FIG. 2 shows schematically an apparatus device suitable for being employed in some embodiments of the application.

With respect to FIG. 2, a schematic block diagram of an exemplary apparatus or electronic device 10 which may be used to record and capture the audio scene format is shown. It would be appreciated that the example shown in FIG. 2 is also in some embodiments suitable for listening to or rendering the audio signal from the network/storage device 111. As such the apparatus 10 is shown to comprise both audio capture and audio rendering components. However in some embodiments the apparatus 10 is configured to only be configured as a capture device or only configured to be an audio rendering device and as such the apparatus 10 in such embodiments can comprise a subsystem of the following components suitable to carry out either the rendering or capturing operations only.

With respect to FIG. 2 a schematic block diagram of an exemplary electronic device 10 or apparatus which can incorporate embodiments of the application are shown. The apparatus can in some embodiments be a mobile terminal or user equipment of a wireless communication system. In other embodiments the apparatus 10 can be any suitable audio or audio subsystem component within an electronic device. For example in some embodiments the electronic device or apparatus 10 can be an audio player (also known as MP3 player), a media player (also known as MP4 player), or any suitable audio capture/audio rendering device incorporating the codecs as described hereafter.

The electronic device 10 in some embodiments comprises at least one microphone within a microphone array 11, which is connected via an analogue-to-digital converter (ADC) 14 to a processor 21. The processor 21 is further linked via a digital-to-analogue converter (DAC) 32 at least one loudspeaker 33. The processor 21 is in some further embodiments further connected or linked to a transceiver (RX/TX) 13, and also to a user interface (UI) 15 and to a memory 22.

The processor 21 can in some embodiments be configured to execute various program codes. The implemented program code can in some embodiments comprise audio encoding code (or speech encoding code) in the example of an audio capture device and/or audio decoding code (or speech decoding code) in the example of the audio rendering system. The implemented program codes can in some embodiments be stored, for example, within the memory 22 and specifically within a program code section 23 of the memory 22 for retrieval by the processor 21 whenever needed. The memory 22 can in some further embodiments provide a data storage section 24, for example for storing data which has been encoded in accordance with embodiments of the application, and/or storing data prior to encoding according to embodiments of the application, and/or storing encoded data prior to decoding according to embodiments of the application, and/or storing decoded audio data prior to presentation of the audio via the loudspeaker 33.

The encoding and/or decoding code can in some embodiments of the application be implemented at least partially in hardware or firmware where specified hardware is provided to carry out the operations disclosed hereafter.

The user interface 15 enables a user to input commands to the apparatus 10, for example via a keypad, and/or to obtain information from the apparatus 10 for example via a display. It would be understood that in some embodiments the operations of input of data and display of data can be implemented by a touch screen display.

The transceiver 13 enables communication with other devices, for example via a wireless communications network.

It is to be understood that the structure of the apparatus 10 could be supplemented and varied in many ways and only schematically represents the components or features which are directly concerned with some embodiments of the application.

Figure 3:
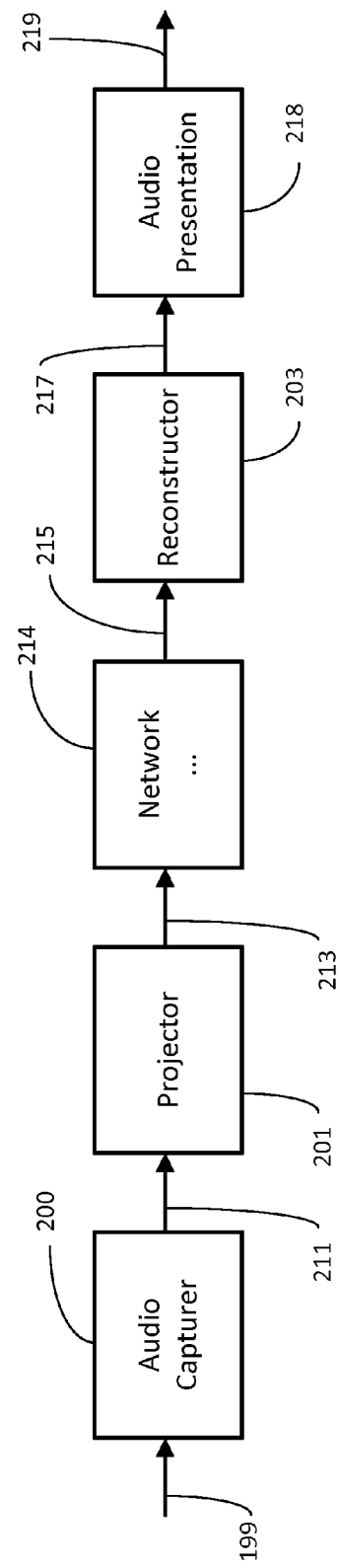
FIG. 3 shows schematically an overview of parts of the system shown in FIG. 1 within which some embodiments of the application may be implemented.

With respect to FIG. 3 an overview of the operation from audio capture to audio presentation according to embodiments of the application are shown.

The apparatus 10 can in some embodiments receive the acoustic signals 199 and use an audio capturer 200 to capture the acoustic signals 199 and pass captured audio signals 211 to the projector 201. In such embodiments the audio capturer 200 can comprise the at least one microphone 11 to generate audio signals 211 to be projected or encoded.

The analogue-to-digital converter 14 can in some embodiments convert the input analogue audio signal from the at least one microphone into a digital audio signal suitable for processing via the processor 21 and provide the digital audio signal to the processor 21.

In some embodiments the apparatus 10 can receive an audio bit stream with audio signals from a further electronic device via the transceiver 13 to be compressed using the encoding operations described hereafter rather than receiving the audio signals via the at least one microphone 11 and analogue-to-digital converter 14. In such embodiments the audio capturer 200 and the projector 201 components can therefore be located separately from each other and the audio signal 211 passed between them using a wired or wireless communications connection. For example the audio capturer 200 can in some embodiments comprise a Bluetooth microphone/headset configured to communicate wirelessly with the user equipment apparatus 10 which comprises the projector 201.

In some further embodiments the microphone 11 is a solid state microphone, in other words the microphone comprises both an analogue microphone component and an analogue-to-digital converter and as such can output digital audio signals directly to the projector 201 which in some embodiments can be implemented by the processor 21.

A corresponding program of code can in some embodiments be activated to this end by the user via the user interface 15.

The projector 201 can in some embodiments receive the audio signal 211 and output an encoded or projected audio signal 213 for output over a network or storage in a memory for later recall. In some embodiments a corresponding program or code can in embodiments be activated to this end by the user by the user interface is or activated by the capture code or program. This code which can be run by the processor 21 causes the processor 21 to execute encoding or projection code stored in the memory 22 within the program code section 23.

The projector 201 is configured to compress and format the audio signals in a suitable manner to output a compressed audio signal 213 representing the captured audio signal.

As shown in FIG. 3 the compressed multi-channel audio signal is passed to the network 214 which outputs a copy of the compressed audio signal 215 to a reconstructor 203. However it would be appreciated that in some embodiments the compressed audio signal 215 can be stored in memory to be recalled at a later instance by the apparatus 10 or a further apparatus.

The reconstructor 203 is configured to reconstruct a version of the audio signal 211 from the copy of the compressed audio signal 213 by generating a reconstructed audio signal 217.

Figure 4:
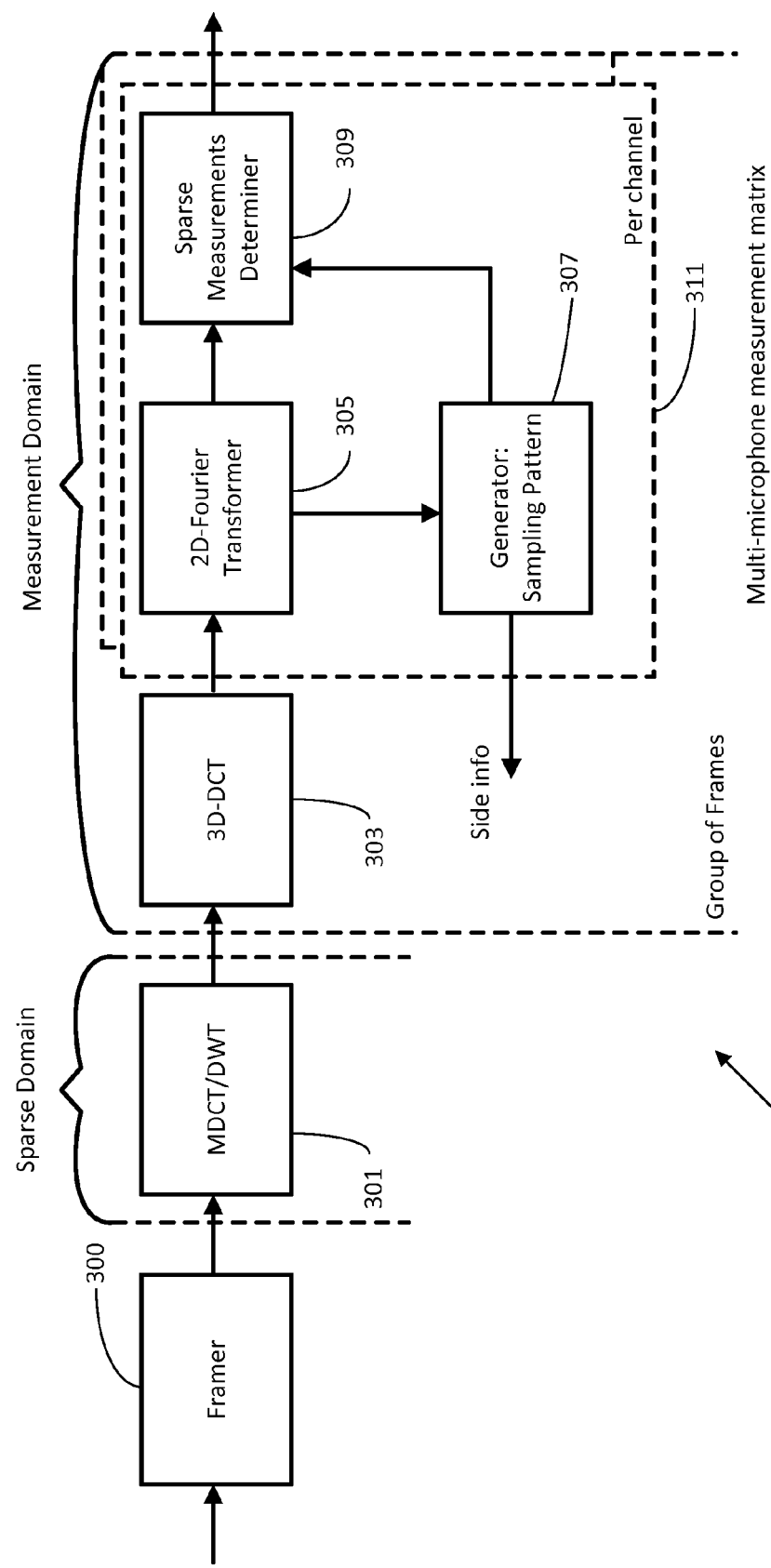
FIG. 4 shows schematically an audio projector apparatus as shown in FIG. 3 according to some embodiments of the application.

An example of a projector 201 according to some embodiments of the application is shown with respect to FIG. 4. Furthermore the operations of the projector 201 according to some embodiments are shown in further detail with respect to FIG. 5. It would be understood that in some embodiments of the application the projector 201 can be implemented within the processor 21 of the apparatus. In some embodiments the projector 201 and the hereafter described components of the projector 201 can be implemented as software which can be stored in the memory and employed by the processor 21, as hardware, or any suitable combination or arrangement of hardware and software.

In some embodiments the projector 201 comprises a framer 300. The framer 300 is configured to receive the digital audio signals, which in some embodiments are in the form of samples and group or frame the samples. The frames are groups of audio samples which can in some embodiments overlap. For example in some embodiments each frame can comprise a 10 ms window of audio samples, which overlap by 5 ms with the proceeding and succeeding frames. However it would be appreciated that any suitable frame periodicity could be employed. The framer 300 is configured to output the frames to a time-to-sparse domain transformer 301.

Figure 5:
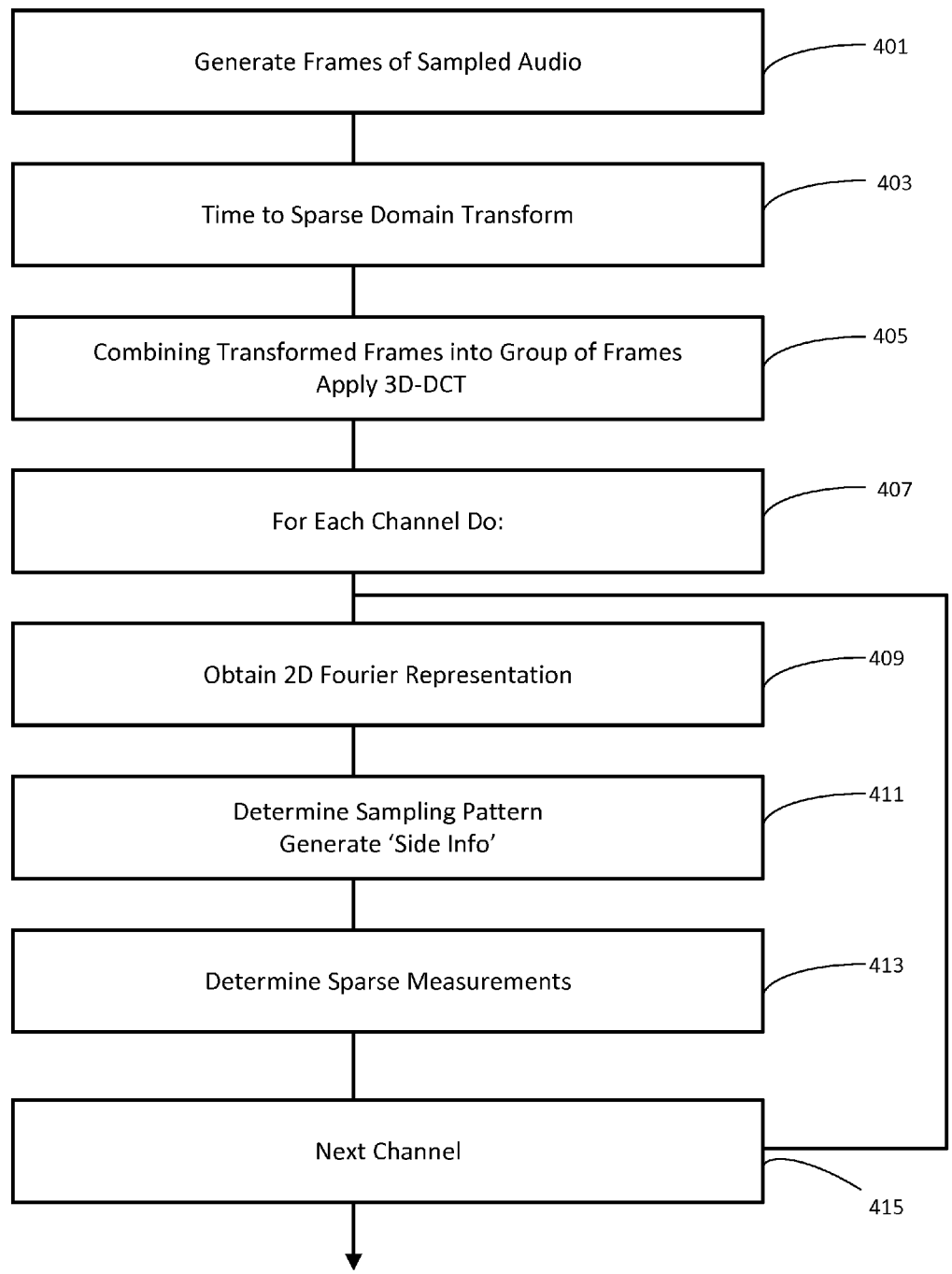
FIG. 5 shows schematically operations of the audio projector apparatus as shown in FIG. 4 according to some embodiments of the application.

The operation of generating frames is shown in FIG. 5 by step 401.

In some embodiments the projector 201 comprises a time-to-sparse domain transformer 301. The time-to-sparse domain transformer 301 is configured to perform a transformation on the time domain samples to generate an output signal which has significant sparse areas. The time-to-sparse domain transformer 301, or in some embodiments an audio-to-sparse domain transformer can in some embodiments be a Modified Discrete Cosine Transformer (MDCT) or a Discrete Wavelet Transformer (DWT). The output from the time-to-sparse domain transformer 301 is passed to a 3D Discrete Cosine Transformer determiner 303. It would be appreciated that any suitable transforming means configured to transform an audio signal into a sparse domain signal can be employed in some embodiments of the application.

The operation of performing a time-to-sparse domain transformation is shown in FIG. 5 by step 403.

In some embodiments the projector 201 further comprises any suitable means for transforming the sparse domain signal into a measurement domain signal. For example in some embodiments the projector 201 comprises a sparse to measurement domain transformer. In some embodiments the sparse to measurement domain transformer can comprise a multi-stage operation. For example in some embodiments the sparse to measurement domain transformer can comprise a first transformer to transform the sparse domain signal into an intermediate domain and a further transformer to transform the intermediate domain into the measurement domain. Furthermore as shown below the first transformer can be configured to operate across multiple channel sparse signal information in order to further enhance the operation of the transforms whereas the second transformer can be configured to operate on single channel intermediate domain information.

In some embodiments the projector 201 can thus comprise a 3D Discrete Cosine Transformer (3D DCT) 303. The 3D DCT 303 receives the sparse domain signals output by the time-to-sparse domain transformer 301 for each channel. The 3D DCT 303 furthermore in some embodiments groups the sparse domain signals for each channel and over a series of frame periods, and then applies a 3D Discrete Cosine Transform to the channel, time and frequency dimension group in order to obtain a three dimensional Discrete Cosine Transformation representation of the sparse domain audio signal. In some other embodiments the 3D DCT 303 can be replaced by a suitable discrete sine transform (DST) or Karhunen-Loeve transform (KLT).

The 3D DCT 303 in some embodiments groups the sparse domain signals by concatenating successive frames. For example in some embodiments where a frame is around 20 ms and a window size of 1.3 s-5 s for the 3D DCT processing can be used. In such embodiments the number of frames in a 3D DCT group can vary between 64-256.

The operation of performing a three dimensional Discrete Cosine Transformation (3D DCT) on the sparse domain representations over a group of frames across the multi-channels is shown in FIG. 5 by step 405.

The 3D DCT 303 passes each channel part of the 3D DCT output signal to a channel encoder 311.

In some embodiments the projector 201 comprises a channel encoder 311 per audio channel to be projected/encoded. In other words in some embodiments each channel encoder 311 is associated with a microphone of the microphone array 11. Each channel encoder 311 is thus configured to perform an encoding operation on a single channel. The channel encoder 311 is in some embodiments configured to comprise a two dimensional Fourier Transformer (2D FT) 305. The 2D Fourier Transformer 305 is configured to receive the channel Discrete Cosine Transformation representation of the signal and output a two dimensional Fourier representation of this signal for a particular channel. In some embodiments the 2D FT can be considered to be the further transformer configured to receive the 3D DCT intermediate domain information for each channel and generate a measurement domain signal for each channel.

In some embodiments an one dimensional Fourier transform is applied to each dimension of the channel, that is, for the time and for the frequency dimension. Although it is possible to apply a 2D Fourier transform directly to both time and frequency dimension of the channel, as Fourier transform is a separable transform from an implementation point of view, applying 2 one-dimensional transforms instead of one 2D transform is possible.

The two dimensional Fourier Transfer 305 is configured to pass the 2D Fourier representation of the channel signal to a sampling pattern generator 307 and to a sparse measurements determiner 309.

As shown in FIG. 5 the setting up of a loop for each channel is shown in FIG. 5 by step 407. It would be understood that although the operations as shown in FIG. 5 show a sequence or series of further encoding and measurement operations per channel and the apparatus as shown in FIG. 4 show a parallel operation per channel of further encoding any of the two implementations (parallel/series) or a hybrid of the two implementations (partial parallel/partial series) further encoding/measurement operations can be implemented.

Furthermore the operation of obtaining a two dimensional Fourier representation for DCT channel representation is shown in FIG. 5 by step 409.

In some embodiments the channel encoder 311 further comprises processing means configured to determine a sampling pattern dependent on the measurement domain signal. For example in some embodiments the channel encoder comprises a sampling pattern generator 307 or sampling pattern determiner. The sampling pattern generator 307 is configured to receive the two dimensional Fourier transformed information and generate from this representation a sampling pattern to be used by the measurement determiner 309. The sampling pattern generated can be further encoded as "side" information by the sampling pattern generator 307 and passed to the decoder/reconstructor for regenerating the sampling pattern.

The operation of determining the sampling pattern and generating side information is shown in FIG. 5 by step 411.

The sampling pattern generated by the sampling pattern generator 307 is output to the sparse measurement determiner 309.

In some embodiments the channel encoder 311 further comprises measuring means configured to measure the measurement domain signal dependent on the sampling pattern. For example in some embodiments the channel encoder 311 comprises a sparse measurement determiner 309.

The sparse measurement determiner 309 is configured to determine a sparse measurement of the two dimensional Fourier representation of the audio signal using the sampling pattern generated by the sampling pattern generator 307. The output of the determined sparse measurements can then be passed to the network or stored as the channel encoding.

The determination of the sparse measurement is shown in FIG. 5 by step 413.

As shown in the series operation representation shown in FIG. 5 the encoding/projection operation may be controlled such that if there are further channels to be encoded then the operation passes back to the operation of obtaining further two dimensional Fourier representations of the remaining channel or channels. Furthermore where the end of the channel list has been reached then the operation of encoding the current group of frames is ended and the encoded values can be combined with the side information.

Thus in summary compressed sensing measurements for audio signals can be formulated as follows. As described above the audio signal x(t) can be sampled at the audio Nyquist rate whereby the signal can be processed in blocks or frames of N samples. Each frame is then a N×1 vector $x_k$, where k represents the time dependence for the frame of samples, for example the start of the frame. The sample vector $x_k$ can be represented as $x_k = \Psi \cdot X_k$ where $\Psi$ is a N×N matrix whose columns are the similarly sampled basis functions $\Psi_i(t)$ and $X_k$ is the vector that chooses the linear combinations of the basis functions. $X_k$ can be thought of as $x_k$ in the domain of $\Psi$ and it is $X_k$ that is required to be sparse for compressive sampling to perform well. In the above examples the $X_k$ vector is the output of the time to sparse transformer defined by $\Psi$.

At the capture it can be seen that we take M non-adaptive linear measurements of $x_k$, where M is less than N resulting in the M×1 vector $Y_k$. The measurement process can therefore be summarised as $$y_k = \Phi_k \cdot x_k$$

where $\Phi_k$ is a M×N matrix representing the measurement process.

In other words $\Phi$ is the resultant 3D DCT/2D FT conversion following the MDCT time to sparse domain transform. In such manner the measurement matrix $\Phi$ in this case is not actually a matrix per se but should be viewed as a function that takes the sparse signal and acquires a small number of measurements of the input.

Figure 6:
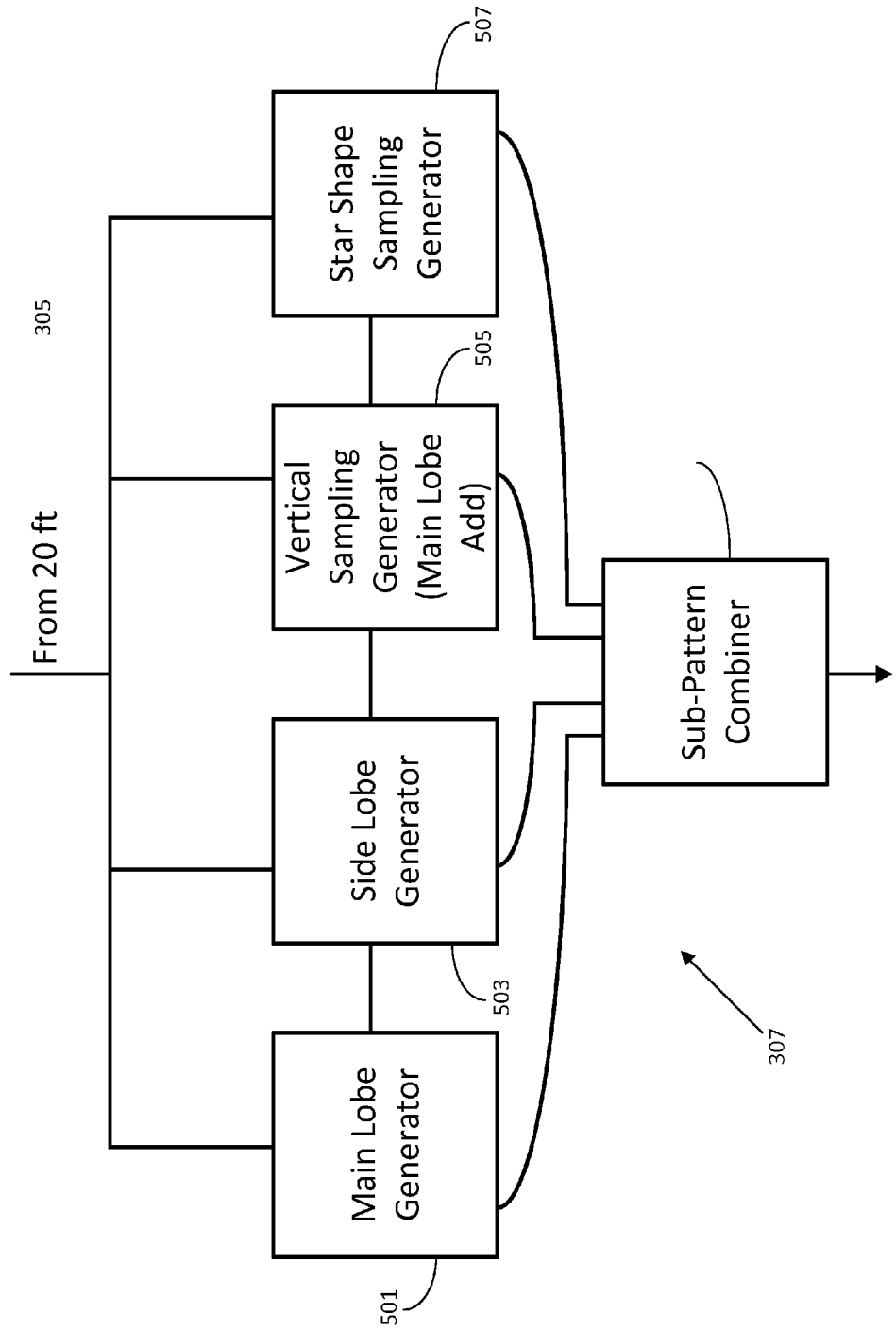
FIG. 6 shows schematically the sampling pattern generator apparatus as shown in FIG. 4 according to some embodiments of the application.
Figure 7:
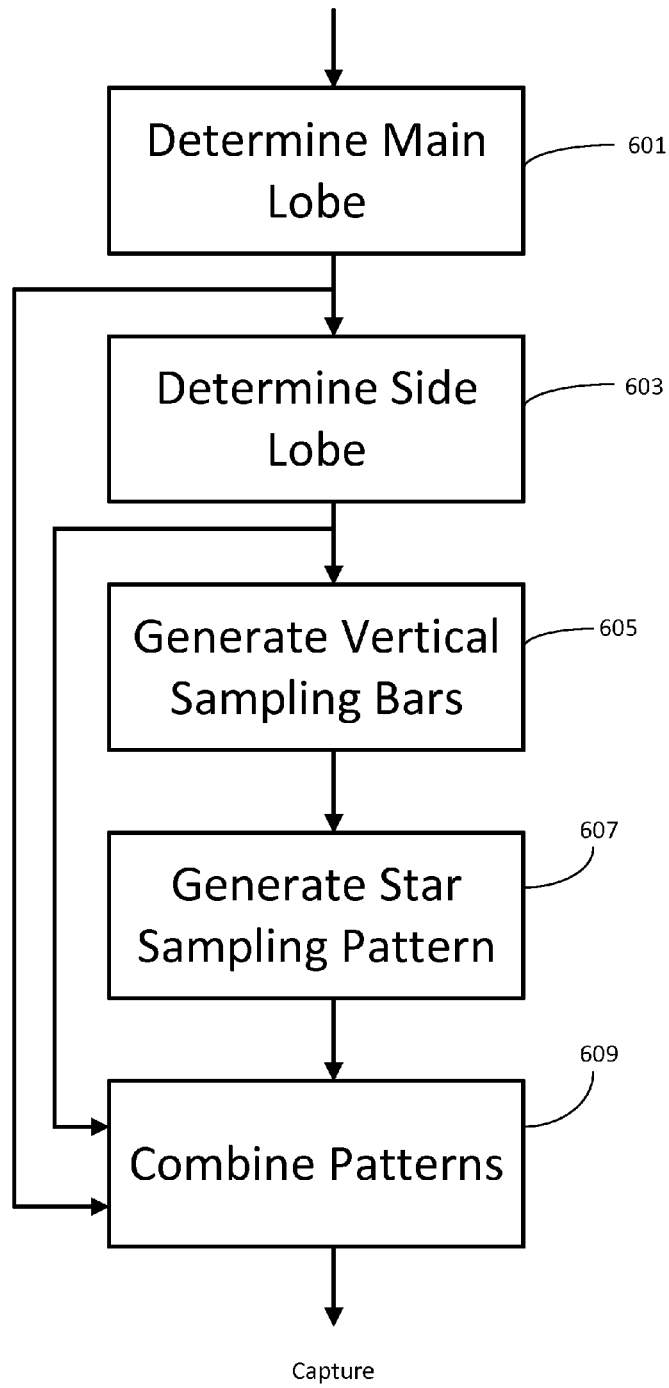
FIG. 7 shows schematically operations of the sampling pattern generator apparatus as shown in FIG. 4 according to some embodiments of the application.

With respect to FIGS. 6 and 7 the sampling pattern generator 307 is shown in further detail. The sampling pattern generator 307 is configured to generate a sampling pattern within which the sparse measurement determiner uses to sample or measure the output of the two dimensional Fourier obtainer 305.

Figure 14:
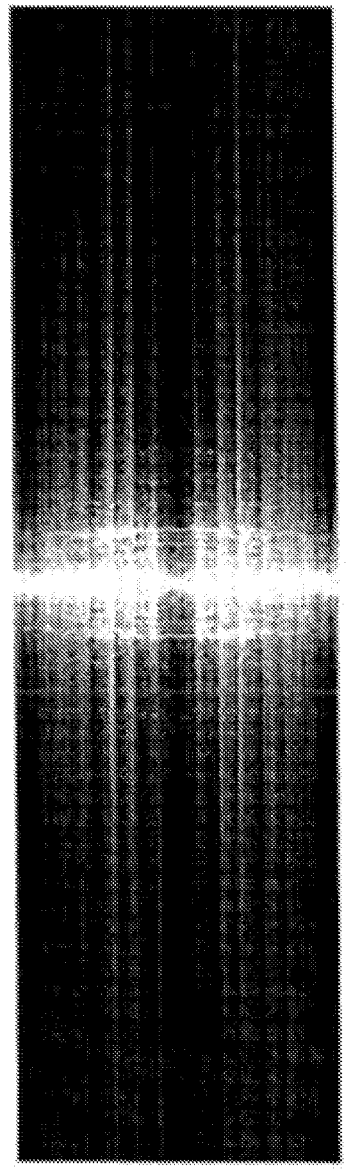
FIG. 14 shows schematically an example of an audio signal in the measurement domain.
Figure 15:
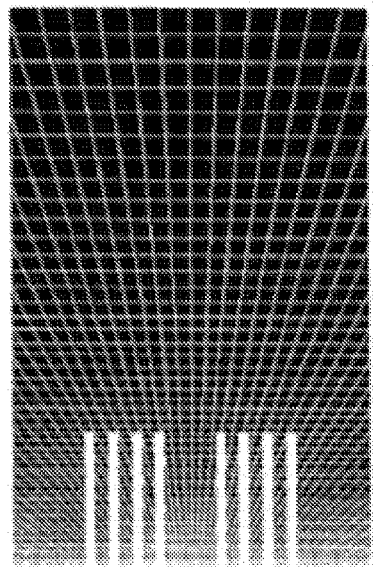
FIG. 15 shows schematically an example of a sampling pattern.

With respect to FIGS. 14 and 15, an example of a 2D FT signal and an associated sampling pattern are shown respectively whereby the vertical axis represents the time domain and the horizontal axis the frequency domain for a single channel. The sampling pattern comprises four sub-patterns, a main lobe sub-pattern, a side lobe sub-pattern, a vertical sampling sub-pattern and a star shape sampling sub-pattern.

The sampling pattern generator 307 or sampling pattern determiner in some embodiments comprises a main lobe generator 501 or main lobe determiner. The main lobe generator 501 is configured to generate the main lobe sub-pattern. The main lobe describes an "event" where every element in the signal is measured if the element location falls within the boundaries of the main lobe. The main lobe generator 501 in some embodiments determines the main lobe sub-pattern based on the passed 2D FT representation using the following approach as described in pseudo-code

```
1        tSum = ∑_{r=0}^{nR-1} ( ∑_{c=0}^{nC-1} tSig(r, c) )
2
3        For cIdx = 0 to nC - 1
4
5            f = tSigImg(0:nR-1, nC/2-1 - cIdx: nC/2 + cIdx);
6            tSum = ∑_{i=0}^{length(f)} f(i)
7
8            If fSum/tSum > eThr
9                mainLobeIdx = cIdx;
10               Exit for loop
11           Endif
12       Endfor
``` where nR and nC describe the vertical and horizontal dimension of the 2D signal and tSig is the signal variable in the measurement domain. The main lobe generator 501 can in some embodiments, as described above by the pseudo-code, first generate the total sum of the signal energy envelope (which is shown on line 1 of the above pseudo-code). The main lobe generator 501 can in some embodiments then determine the width of the main lobe (as loop defined between lines 3 and 12).

The main lobe generator 501 in some embodiments calculates the signal energy when the width of the main lobe is a loop variable number of horizontal elements to both dimensions with respect to the centre of the signal (this loop variable is defined in the above pseudo-code by cIdx). The main lobe generator 501 furthermore in some embodiments can check whether the energy of the main lobe exceeds the main lobe threshold, (this check step is shown in the above pseudo-code in line 8). Where the main lobe threshold value is exceeded the width of the main lobe has been found. Otherwise the width of the main lobe can be increased, for example in some embodiments by an element at a time, and the calculation is repeated.

In some embodiments a further limit to the width of the main lobe may be set according to the main lobe generator 501, in other words a limit is set to the value of mainLobeIdx in case the value becomes too large and that too large a number of measurements are having to be taken. When this limit is reached the threshold value can be reduced, defined as the variable, eThr. For example in some embodiments the threshold can be decreased by multiplying it by a fraction less than 1 and repeating the operations (such as 0.95 so that new eThr=0.95×eThr).

Figure 16:
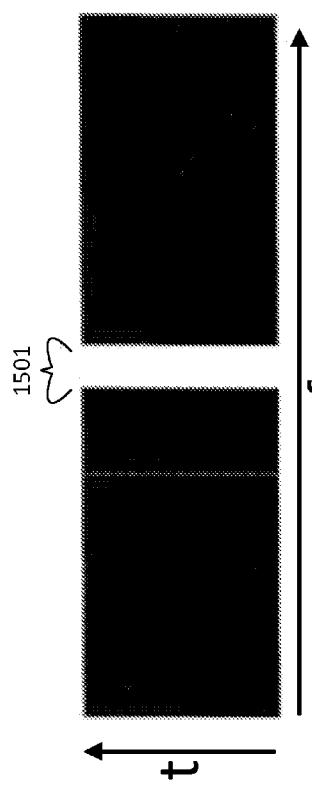
FIG. 16 shows schematically an example sub-pattern for the main lobe.

With respect to FIG. 16, a main lobe sub-pattern is shown whereby the vertical direction shows a temporal representation and the horizontal direction a frequency representation whereby it can be seen in FIG. 16 that the main lobe sub-pattern where the sampling matrix has a dimension of 128× 512, the main lobe generator 501 can set the main lobe sampling (represented by white pixels) 1501 as 15.

The determination of the main lobe width is shown in FIG. 7 by step 601.

The side lobe generator 503, or side lobe determiner is configured also to receive the 2D FT representation and to generate the side lobe sub-pattern which describes or attempts to measure important horizontal "spikes" in the signal which can be used to provide further improvements to the signal as it is measured. In some embodiments the side lobe generator 503 is configured to generate the side lobe sub-pattern according to the following pseudo-code:

```
1     rSum(r) = ∑_{t=0}^{nC-1} tSig(r, c), 0 ≤ r < nR
2
3     Sort rSum to decreasing order of importance; the corresponding indices
      are stored to rIdx
4
5     Div(r) = rSum(r + 1)/rSum(0), 0 ≤ < nR - 1
6
7     Find first index number (tIdx) where Div(tIdx) < 0.6
8
9     Sort sIdx(r) = rIdx(r), 0 ≤ r < tIdx + 1 to decreasing order of importance
10
11    Determine relevant side lobe indices :
12
13    m = 0; nIdx = 0;
14    nLen = tIdx + 1;
15    while nLen > 1
16
17       nIdxUsed = 1;
18       startIdx = sIdx(m);
19       ss = startIdx;
20       m = m + 1;
21       nLen = nLen - 1;
22
23       while nLen > 1
24          diff = ss - sIdx(m);
25          ss = sIdx(m);
26
27          if diff > 8
28             break;
29          else
30             m = m + 1;
31             nLen = nLen - 1;
32             nUsedIdx = nUsedIdx + 1;
33             startIdx = startIdx + sIdx(m);
34          Endif
35       Endwhile
36
37       if nUsedIdx > 2
38          stgIdx(nIdx) = round(startIdx/nUsedIdx);
39          nIdx = nIdx + 1;
40       Endif
41    Endwhile
42
43    Determine strength of the side lobe indices :
44
45    For k = 1 to nIdx
46
47       st = tSig(stgIdx(k), nC/2:nC-1);
48
          iSum = 1.0 / ∑_{i=0}^{length(st)} st(i)
49
50       aSum = 0;
51       for t = 1:length(st)
52          aSum = aSum + st(t);
53          if aSum * iSum > 0.95
54             Exit for loop;
55          Endif
56       Endfor
57
58       nBinIdx(k) = t;
59
60    Endfor
61
62    Average the strength of the side lobe indices :
63
64       mn = (1/nIdx) · ∑_{k=0}^{nIdx-1} nBinIdx(k)
65    sigLen(k) = mn, 0 ≤ k < nIdx
66    sigPat(k) = stgIdx(k), 0 ≤ k < nIdx
```

The side lobe generator 503 is in some embodiments configured to calculate the energy of each horizontal line of the representation (as shown in line 1). The side lobe generator 503 is then further configured in some embodiments to calculate the ratio of the largest energy value with respect to the remaining values (as is shown in line 5 of the above pseudo-code). The side lobe generator 503 in some embodiments can be configured to determine or find the index number where the ratio has dropped below a fraction, for example 0.6 of the highest energy. In other words the energy of the index being analysed is at least 0.6 times the highest energy index value. This energy 'drop' determination operation is shown in line 7 of the above pseudo-code.

The side lobe generator 503 is then configured in some embodiments to locate the most important horizontal indices, the localisation of the indices is such that where the difference in values between two neighbouring indices (defined by SIdx) is small enough (for example with a value "8" as shown in line 27 of the above pseudo-code) the two indices can be merged. These merging operations are carried out by the side lobe generator 503 in such embodiments until the difference exceeds the threshold difference where the side lobe generator then can place an index value at an index that represents the average of the merged indices (as shown in line 38 of the above pseudo-code). The operation of locating the most important horizontal indices is thus shown between lines 13 and 41 of the above pseudo-code.

The side lobe generator 503 can (as shown in lines 45 to 60 of the above pseudo-code) in some embodiments determine the strength of each side lobe index, in other words determine the width of each side lobe index. In some embodiments the side lobe generator 503 determines the width of each side lobe by calculating the accumulated energy for each index and once the accumulated energy exceeds a predetermined threshold (for example as shown in line 53 of the above pseudo-code a predetermined threshold value for example can be 0.95), the width for the side lobe index has been found or determined. The side lobe generator 503 furthermore can in some embodiments determine the mean side lobe width which is to be used in the sampling pattern as shown in lines 64 and 65 of the above pseudo-code. This can be carried out by the side lobe generator 503 in order to minimise the amount of side information which is sent to the decoding side. Furthermore the side lobe generator 503 can in some embodiments store the side lobe indices as shown in line 66 of the above pseudo-code.

Figure 17:
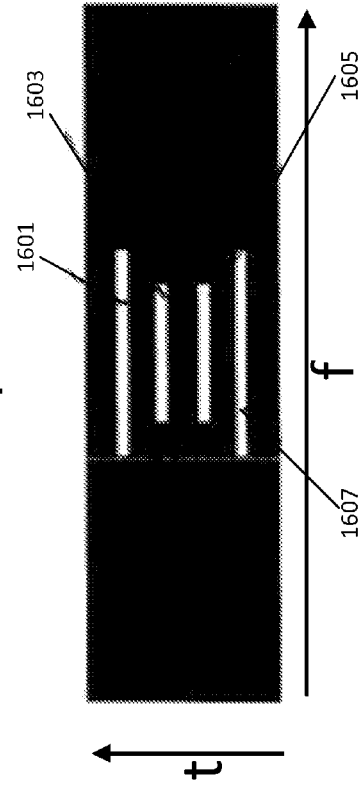
FIG. 17 shows schematically an example sub-pattern for the side lobes.

With respect to FIG. 17 a side lobe sampling pattern is shown whereby there are four sampling side lobe components shown, a first sub-pattern side lobe 1601, a second sub-pattern side lobe 1603, a third sub-pattern side lobe 1605 and a fourth sub-pattern side lobe 1607.

The generation of the side lobe sub-pattern is shown in FIG. 7 by step 603.

The vertical sampling generator 505 or vertical sampling bar pattern determiner is configured to compliment the main lobe measurement sub-pattern with additional vertical sampling bars. In some embodiments the vertical sampling generator 505 is configured to generate the vertical sampling bar sub-pattern using the following pseudo-code implementation:

```
1    mIdx = 0; startIdx = nC/2 + mainLobeIdx + 1
2    For k = 0 to 20 in expInc increments
3
         cIdx = MAX(0, round(e^k)-1)
4
5        If cIdx + startIdx ≥ nC
6            Exit for-loop
7        Endif
8
9        mainLobeExtension(mIdx) = cIdx;
10       mIdx = mIdx + 1;
11   Endfor
``` where MAX( ) returns the maximum of the specified values and round( ) rounds the specified value to the nearest integer. The vertical sampling bars generated by the vertical sampling generator 505 are configured to start at the location where the main lobe width ends (which is defined on line 1 of the above pseudo-code). The vertical sampling generator 505 is further configured to specify a variable which defines the increment size for the vertical side lobe sampling. This variable for example is described above as expInc. The vertical sampling generator 505 determines the next location of the vertical bar, which is shown in the above pseudo-code in line 4. Where the location exceeds the pattern dimensions, in other words exceeding the frequency sampling range the calculations are stopped, otherwise the determined location is accepted and added to the main lobe extension variable mainLobeExtension.

Figure 18:
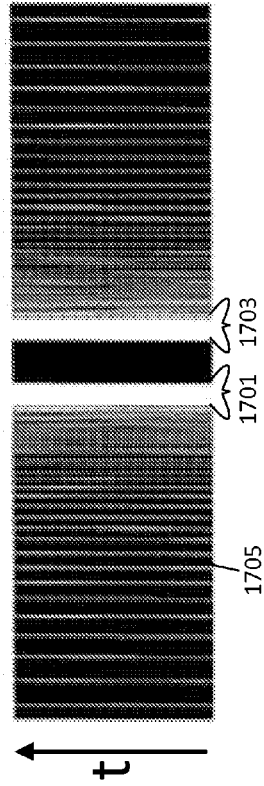
FIG. 18 shows schematically an example sub-pattern for the main lobe additions.

The above pseudo-code implements a non-linear increment however it would be appreciated that in some embodiments linear increments could be implemented. With respect to FIG. 18 an example vertical sampling sub-pattern is shown. In this figure the sampling matrix has the same dimensions as shown for the previous figures and the variable expInc has been set to a value of 0.08. The FIG. 18 shows a dense sampling region either side of the main lobe 1701, 1703 which as the frequency dimension increases changes to a more sparsely sampled region such as the region labelled 1705.

The operation of vertical sampling is shown in FIG. 7 by the step 605.

The star shaped sampling generator 507 or star pattern determiner can in some embodiments generate the star shaped sub-pattern as a two-step process. The first step is to generate a star shaped sampling pattern, and the second step is to extract a sub-part of the generated star shaped sampling pattern. The star shaped sampling generator 507 can in some embodiments generate the star shaped sampling pattern according to the following pseudo-code:

```
1    thc = linspace(0, π-π/L, L);
2    for || = 1:L
```

-continued

```
3
4        if ((thc(||) <= π/4) or (thc(||) > 3 · π/4 ))
5            yr = round(tan(thc(||))*(-N2+1:N2-1))+N2+1;
6            For nn = 1:N-1
7                MM(yr(nn), nn+1) = 1;
8            Endfor
9        Else
10           xc = round(cot(thc(||))*(-N2+1:N2-1))+N2+1;
11           For nn = 1:N-1
12               MM(nn+1, xc(nn)) = 1;
13           Endfor
14       Endif
15
16   Endfor
``` where N=MAX(nR, nC), N2=N/2 and L defines the number of radial lines in the star shape. Furthermore, cot( ) and tan( ) calculate the cotangent and tangent of the argument in radians respectively. The star shaped sampling generator 507 can thus generate a vector of L linearly equally spaced points between 0 and π−π/L. The locations for each radial line are then determined in the star shaped sub-pattern as shown by lines 2 to 16 of the above pseudo-code. For example the star shaped sampling generator 507 can for example as shown on line 4 determine the quadrant where the value in the linearly equally spaced point belongs to. The locations in the sub-pattern are then calculated using basic trigonometric definitions which for example as described in lines 5 to 8 and 10 to 14 of the above pseudo-code.

The star shaped sampling generator 507 can then extract a sub-part of the previously generated star shaped pattern using the following implementation:

```
For rows = 0 to nR - 1
    For columns = 0 to nC - 1
        M_star(rows, columns) = MM(N2 - nR/2 + 1:N2 + nR/2,
    N2 - nC/2 + 1:N2 + nC/2)
    Endfor
Endfor
```

Figure 19A:
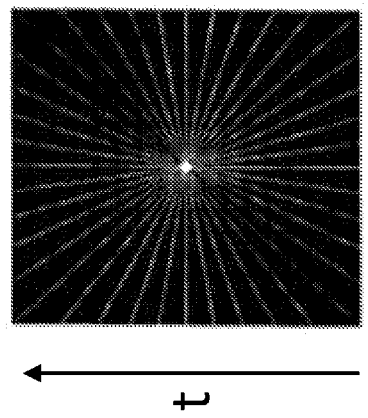
FIGS. 19a and 19b show schematically example sub-patterns for the general star pattern and mapped star pattern.
Figure 19B:
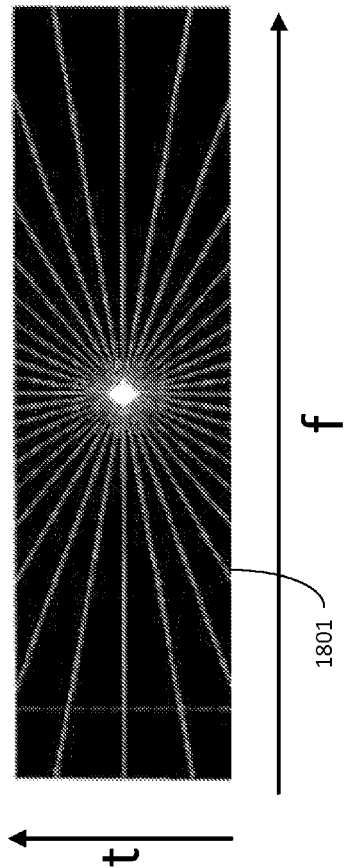

The FIG. 19*a* shows for example the star shaped sampling sub-pattern generated by the star shaped sampling generator 507 and FIG. 19*b* shows a sub-part of the generated star shaped sampling sub-pattern with radial line 1901 marked.

The generation of the star sampling pattern is shown in FIG. 7 by step 607.

The main lobe generator 501, the side lobe generator 503, the vertical sampling generator 505 and the star shaped sampling generator 507 are configured to output the sub-patterns to the sub-pattern combiner 508 which is configured to combine the sub-pattern to generate a combined sampling pattern to the sparse measurement determiner 309. The sub-pattern combiner 508 in some embodiments combines the sub-patterns using the implementation shown below:

```
1                 0 ≤ r < nR
    M(r,c) = 0,
                  0 ≤ c < nC
2
3    M(0:nR-1,nC/2-1-mainLobeIdx:nC/2 + mainLobeIdx)=1
4
5    for k = 1:kLen
6
7        rIdx = sigPat(k) - nTile;
8        if rIdx < 1
9            rIdx = 1;
```

-continued

```
10      Endif
11
12      rIdx2 = sigPat(k) + nTile;
13      if rIdx2 > nR
14          rIdx2 = nR;
15      Endif
16
17      M(rIdx : rIdx2, nC/2 – sigLen(k) : nC/2 + sigLen(k)) = 1;
18      M(nR – rIdx2:nR – rIdx, nC/2 – sigLen(k) : nC/2 +
        sigLen(k)) = 1;
19      Endfor
20
21      For m = 0 to mIdx – 1
22
23      M(0:nR–1, startIdx + mainLobeExtension(m)) = 1;
24      M(0:nR–1, startIdx – mainLobeExtension(m)) = 1;
25
26      Endfor
27
28      M(0:nR–1,0:nC–1)=M(0:nR–1,0:nC–1)+M_star(0:nR–1,0:nC–1)
```

The sub-pattern combiner 508 can thus in some embodiments define an empty sampling pattern (as shown in line 1 of the above pseudo-code). The sub-pattern combiner 508 then in some embodiments retrieves the main lobe sampling pattern using the mainLobeIdx variable (as shown in line 3 of the above pseudo-code). The sub-pattern combiner 508 then in some embodiments generates the side lobe pattern with respect to the main lobe using the +nTile and −nTile indices with respect to the calculated side lobe index. In the implementation shown in FIG. 13 the variable nTile has been set to 3 however it would be appreciated that values other than 3 could be used. The side lobe pattern "generation" and addition is shown in lines 5 to 19 of the above pseudo-code.

The sub-pattern combiner 508 is then further configured in some embodiments to incorporate the main lobe additional or vertical sampling sub-pattern (as shown in lines 21 to 26 of the above pseudo-code).

The sub-pattern combiner 508 further in some embodiments combines the star shaped sampling with the previously combined sampling sub-patterns (as shown in line 28 of the above pseudo-code).

In the above representation a value of 1 or greater in the matrix M would indicate that the corresponding single element at that location in time and frequency domain should be measured.

Figure 20:
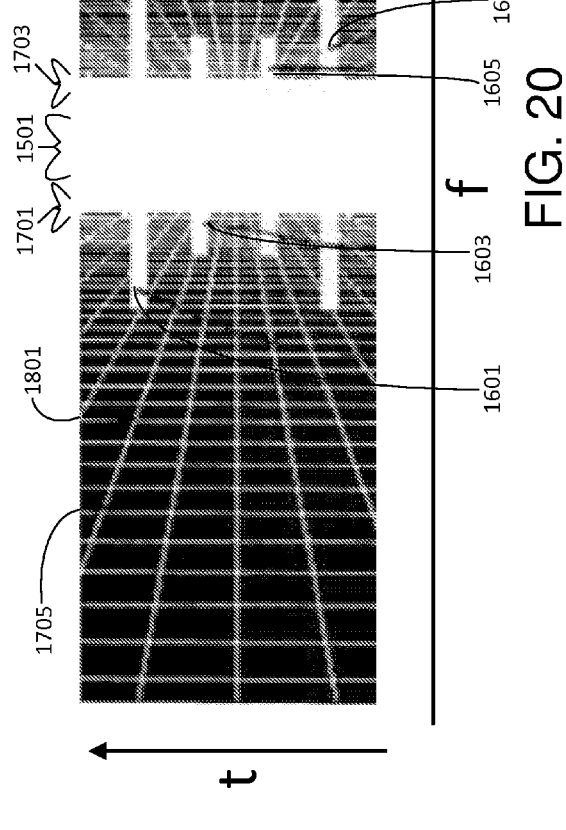
FIG. 20 show schematically the combination of the example sub-patterns as shown in FIGS. 16, 17, 18 and 19b.

For example as shown in FIG. 20, a value of 1 or greater is a white pixel and a value below 1 is a black pixel within which it can be seen the pattern comprises the sub-patterns of the main lobe 1501, the side lobes 1601, 1603, 1605, 1607, the vertical sampling additions 1701, 1703, 1705 and the star radial components of which one radial line 1801 is labelled.

The operation of combining the sub-patterns to generate the measurement pattern is shown in FIG. 7 by step 609.

Figure 8:
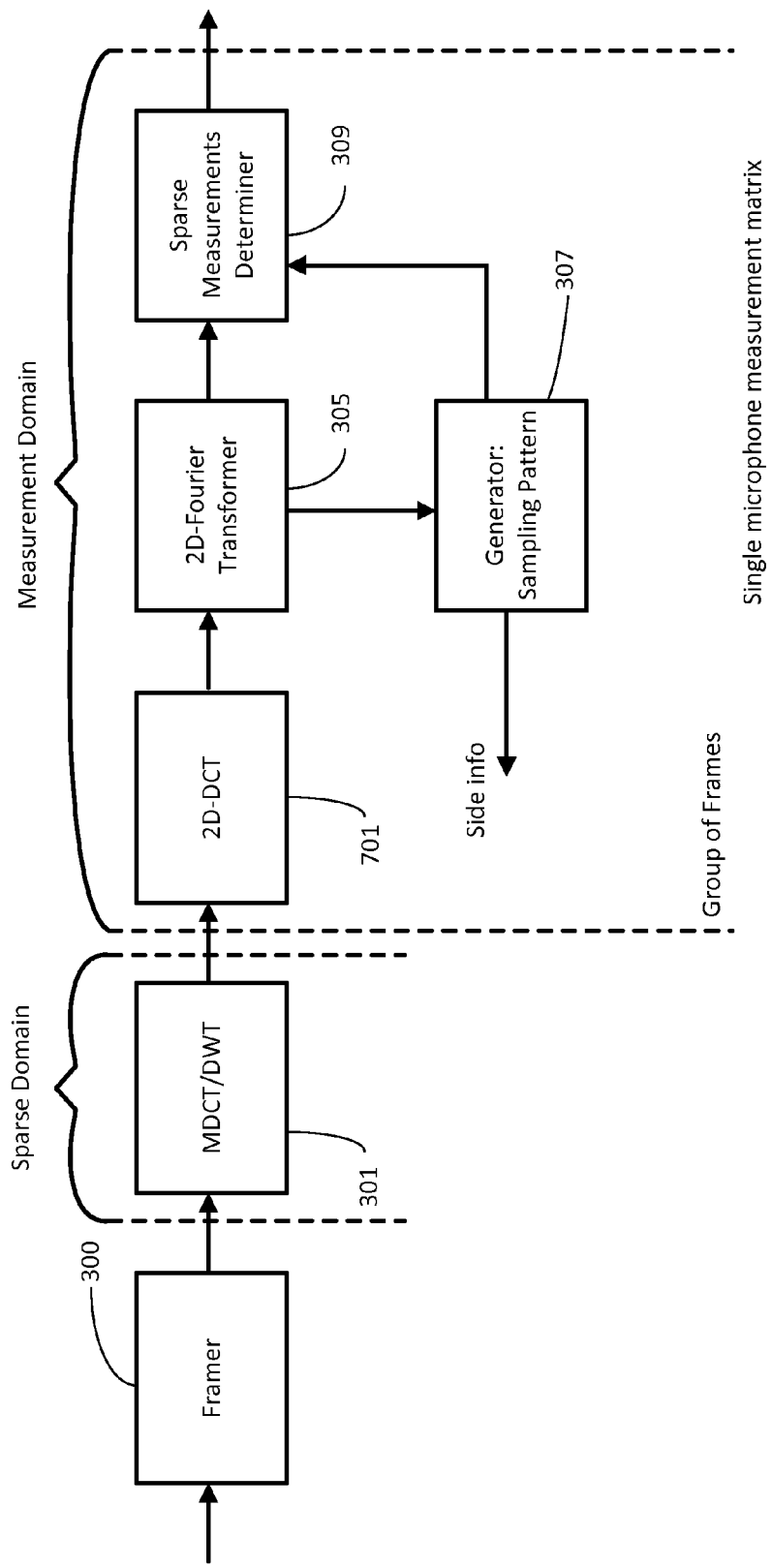
FIG. 8 shows schematically a further audio projector apparatus as shown in FIG. 4 according to some embodiments of the application.

With respect to FIG. 8 a single microphone audio event capture apparatus is shown. The single microphone audio event capture differs from the multiple microphone event capture in that the three dimensional Discrete Cosine Transformer (3D DCT) is replaced by a two dimensional Discrete Cosine Transformer (2D DCT) 701 as there is no additional dimensionality implemented using the multiple channels or microphones. Furthermore only one channel capture apparatus is required.

Figure 9:
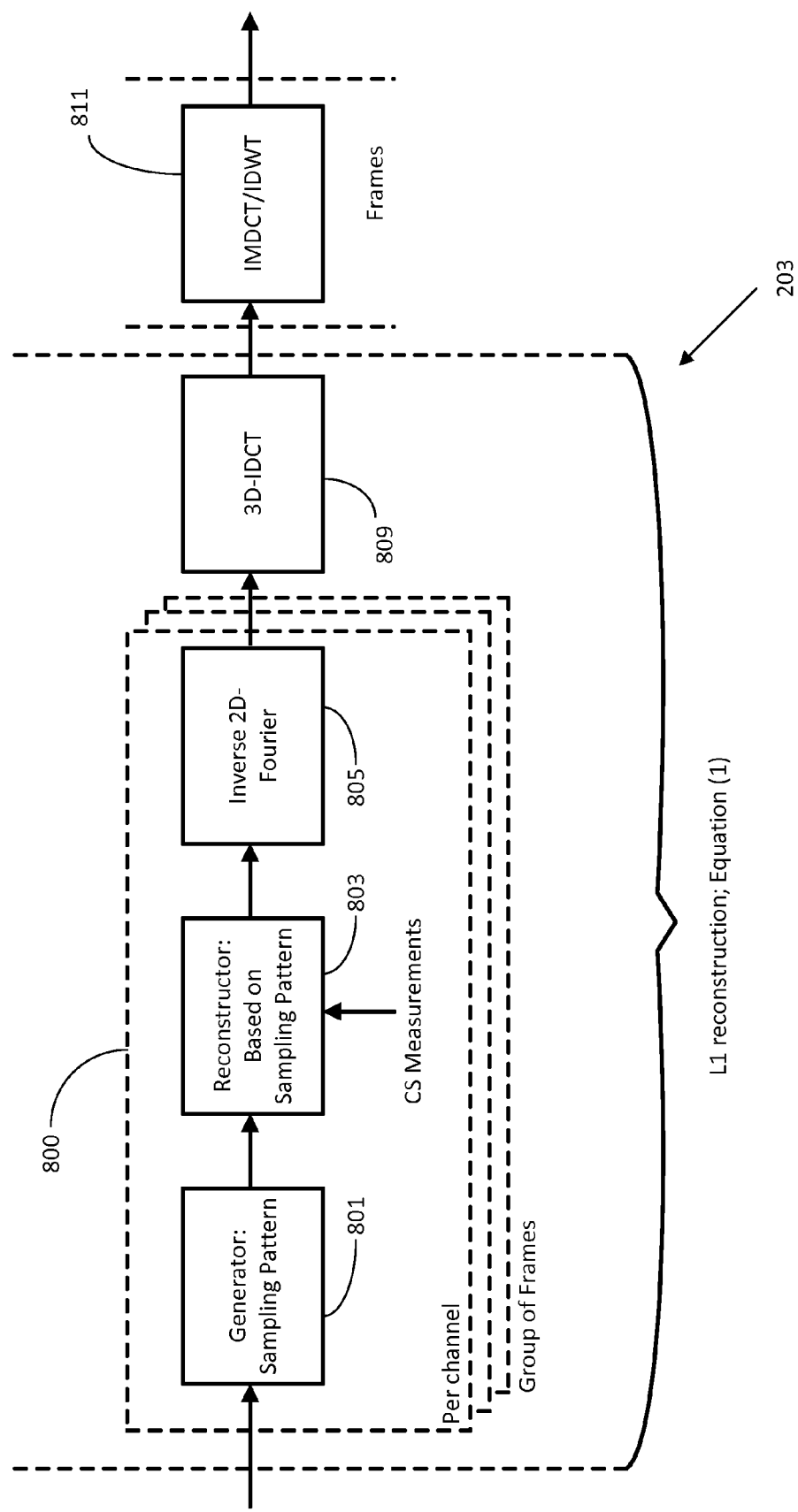
FIG. 9 shows schematically an audio reconstructor apparatus as shown in FIG. 3 according to some embodiments of the application.

With respect to FIG. 9, a reconstructor 203 according to some embodiments is shown in further detail. The operations of the reconstructor according to some embodiments of the application are shown in FIG. 10.

The reconstructor 203 is passed, or receives or retrieves the side information and compressive sampled information.

Figure 10:
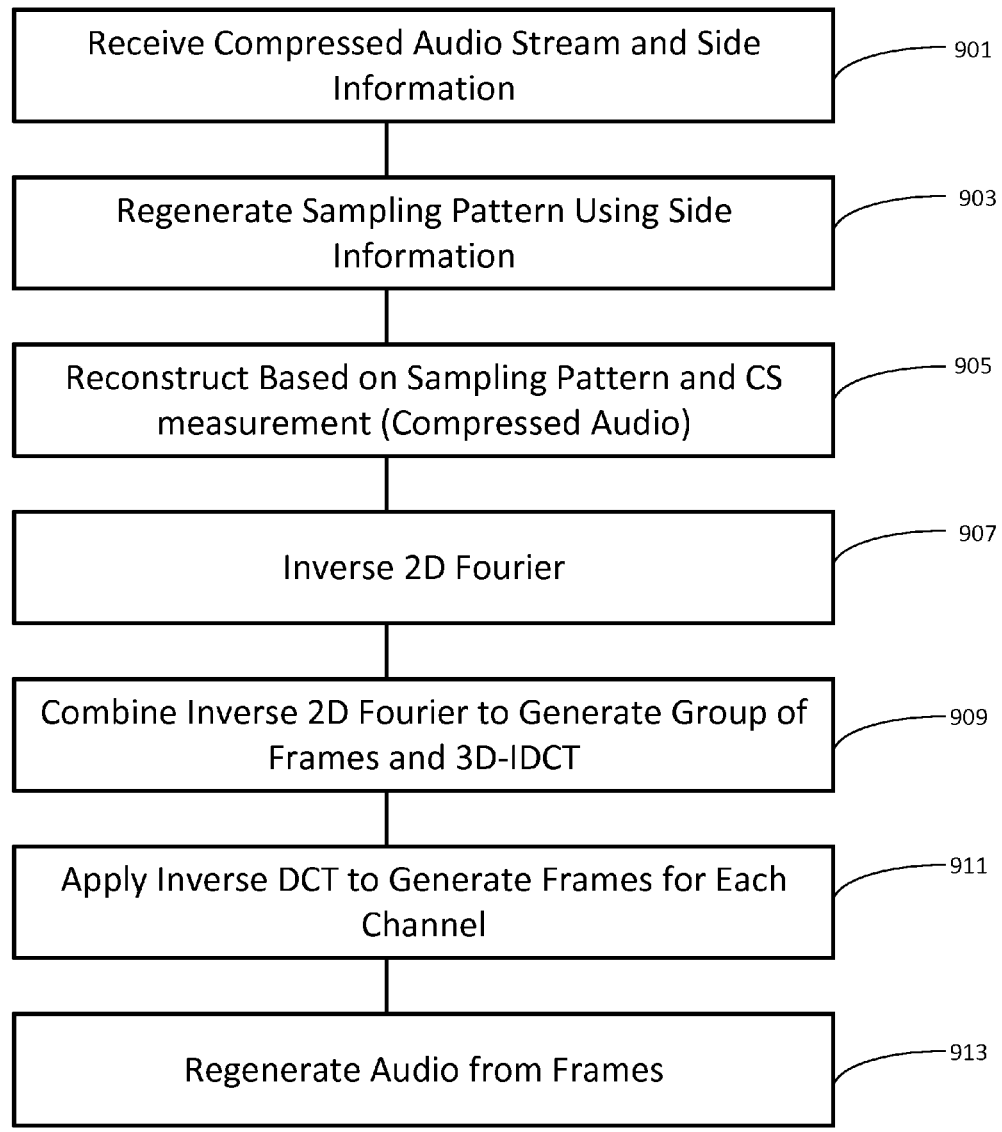
FIG. 10 shows schematically operations of the audio reconstructor apparatus as shown in FIG. 9 according to some embodiments of the application.

Receiving the compressed audio and side information is shown in FIG. 10 by step 901.

The reconstructor 203 in some embodiments comprises a series of channel reconstructors 800. Each channel reconstructor 800, or measurement domain reconstructor, is configured to receive the compressed sampling measurements for each channel and the side information relating to the sampling pattern used to regenerate the DCT components related to the channel. Thus in some embodiments the apparatus or reconstructor can comprise any suitable reconstructor means configured to determine a measurement domain signal dependent on a sampling pattern and a measured measurement domain signal. Each channel reconstructor 800 is therefore configured in some embodiments to pass the DCT components which form a 3D DCT form representing the time, frequency and channel dimensions to a 3D Inverse Discrete Cosine Transformer (3D IDCT) 809.

The channel reconstructor 800 in some embodiments further comprises a sampling pattern generator 801 configured to receive the "side" information with the sampling pattern date and pass a generated sampling pattern to a reconstructor 803. In some embodiments any suitable pattern reconstruction means can be implemented for reconstructing the sampling pattern from any received or retrieved 'side information'.

Figure 11:
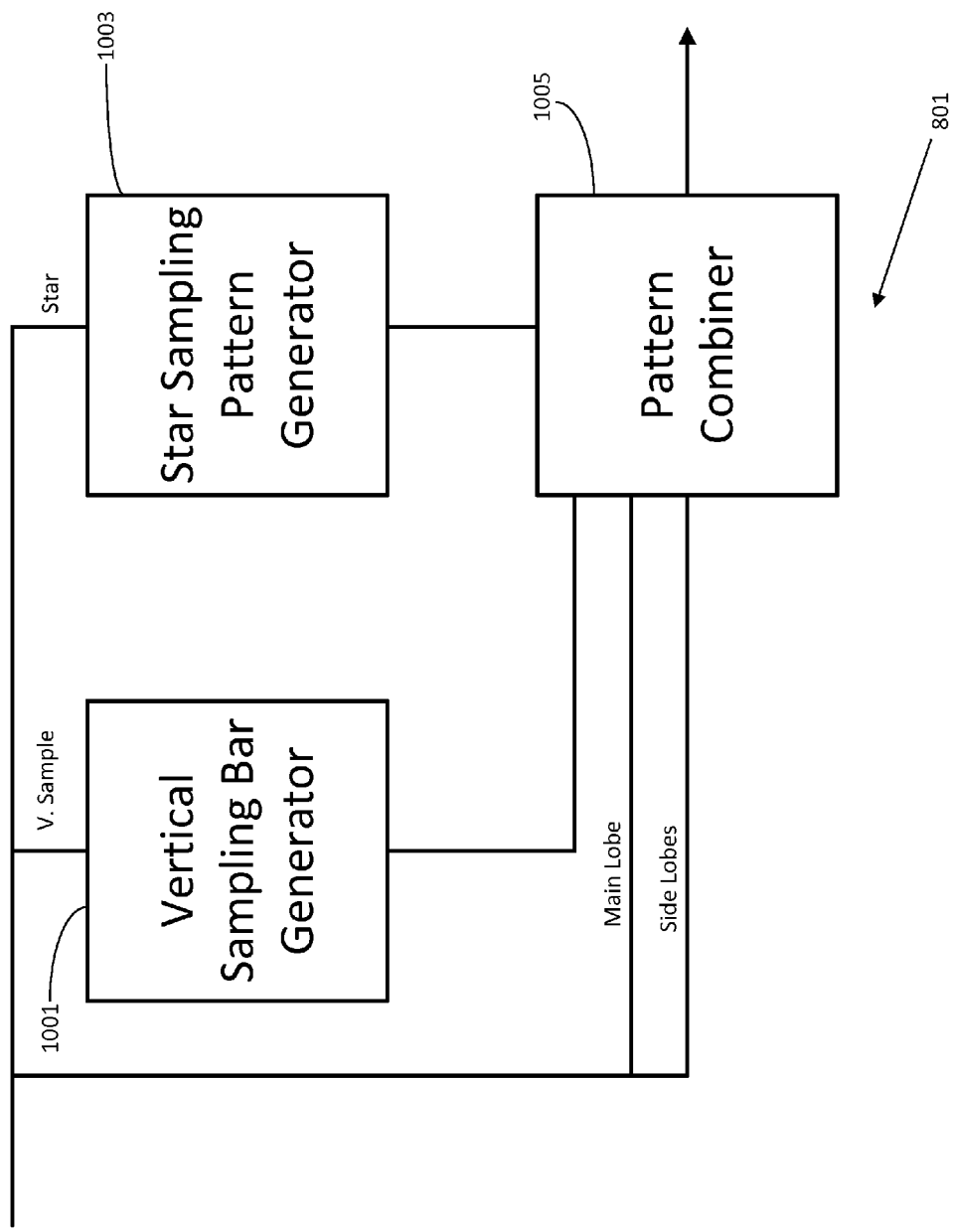
FIG. 11 shows schematically the reconstructor sampling pattern generator apparatus as shown in FIG. 9 according to some embodiments of the application.
Figure 12:
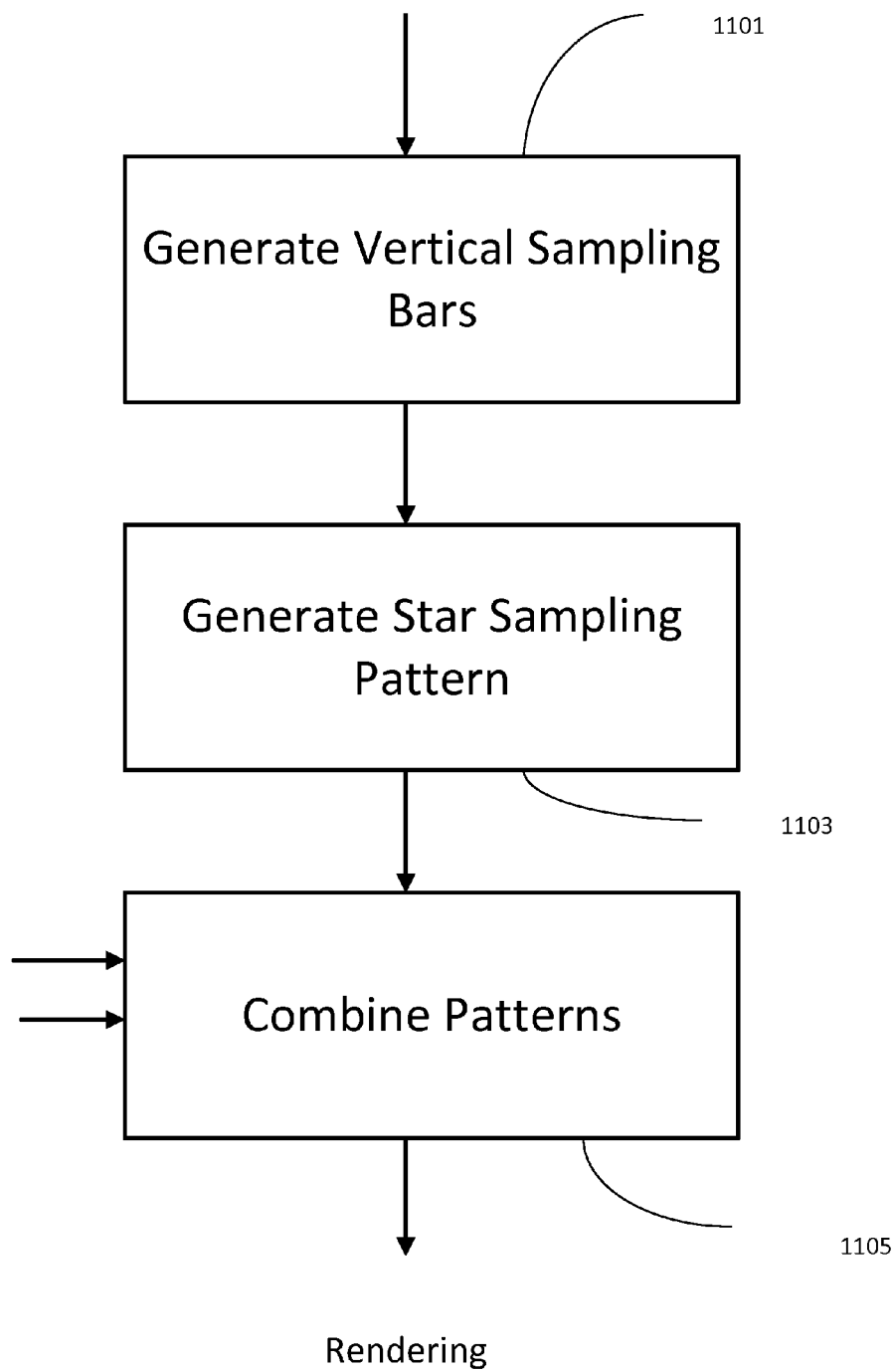
FIG. 12 shows schematically operations of the reconstructor sampling pattern generator apparatus as shown in FIG. 9 according to some embodiments of the application.

The sampling pattern generator 801, sampling pattern determiner, is further shown with respect to FIG. 11 and the operation of the sampling pattern generator further described with respect to FIG. 12. The sampling pattern generator 801 can comprise a vertical sampling bar generator (or determiner) 1001 configured to receive the variable with regards to the spacing of the vertical sampling bar and also the main lobe width to generate the vertical sampling interval in a manner similar to the operation of the vertical sampling generator 505 within the projector 201. The operation of generating the vertical sampling bars from the side information is shown in FIG. 12 by step 1101.

The sampling pattern generator 801 is further configured to receive the star sampling pattern variables in the side information and can in some embodiments comprise a star sampling pattern generator (or determiner) 1003 configured to receive the star sampling pattern variables and generate the star sampling pattern and the cut off section according to a similar method shown in the projector 201 star shaped sampling generator 507.

Furthermore the sampling pattern generator 801 can comprise a pattern combiner 1005 which in some embodiments performs a combination of the patterns in a manner similar to those described with regards to the sub-pattern combiner 508 within the projector 201, in other words capable of running the pseudo-code as described previously, whereby the main lobe variables are used to generate a main lobe pattern over a zero or null matrix, the side lobe patterns are then further added, and then the vertical sampling and star sampling patterns are combined to regenerate the sampling pattern used within the sparse measurement determiner 309 of the projector 201.

The operation of the combination of these sub-patterns is shown in FIG. 12 by the step 1105. The sampling pattern generator 801 can then output the sampling pattern to the reconstructor.

The operation of regenerating the sampling pattern using the side information is shown in FIG. 10 by step 903.

In some embodiments the channel reconstructor 800 further comprises a reconstructor 803 or measurement domain reconstructor. The reconstructor 803 is configured to receive the sampling pattern (regenerated) and also the CS measurements to reconstruct the matrix form. In other words to apply initial operations for back projection of the CS measurements to reconstruct the sparse domain signal using a L1 optimisation algorithm. The reconstructor 803 can in some embodiments use the sampling pattern based on the received side information and place the CS measurements to the locations as specified by the sampling matrix. The reconstructed matrix can in some embodiments be passed to an Inverse two dimensional Fourier Transformer (I 2D FT) 805.

The reconstruction based on the sampling pattern and the CS measurements is shown in FIG. 10 by step 905.

The apparatus, the reconstructor 203, can further in some embodiments employ any suitable transforming means for transforming the measurement domain signal into a sparse domain signal. This in some embodiments can be a multi-stage process as can be described hereafter and can be considered to be the reciprocal to the action generated by the transforming means for transforming the sparse domain signal into the measurement domain signal, which in some embodiments as described above is also a multi-stage process.

In some embodiments the channel reconstructor 800 can further comprise an Inverse 2D FT 805. The Inverse 2D FT 805 generates the reciprocal action to that generated by the 2D FT 305 in the channel encoder. The output of the 2D FT is then passed as one dimension of the DCT form to the 3D IDCT 809.

The application of the Inverse 2D Fourier Transform is shown in FIG. 10 by step 907.

The reconstructor 203 in some embodiments is further configured to comprise a three dimensional Inverse Discrete Cosine Transformer (3D IDCT) 809. The 3D IDCT is then configured in these embodiments to pass the inverse Discrete Cosine Transformation of all of the channels in a channel by channel form to a sparse-to-time domain converter 811. In some other embodiments the 3D IDCT 803 can be replaced by a suitable inverse discrete sine transform (IDST) or inverse Karhunen-Loeve transform (IKLT) where the associated transform in projector 201 has also be replaced.

The combination of the Inverse 2D Fourier Transformations to generate a group of frames followed by an Inverse Discrete Cosine Transformation is shown in FIG. 10 by step 909.

In some embodiments the reconstructor 203 further comprises transforming means configured to transform the sparse domain signal into an audio signal. For example in some embodiments the reconstructor 203 can comprise a sparse-to-time domain transformer or converter 811. The sparse-to-time domain transformer converter can be in some embodiments an Inverse Modified Discrete Cosine Transformer (IMDCT) or an Inverse Discrete Wavelet Transformer (IDWT). The sparse-to-time domain transformer operates on a per frame basis to output the audio signal for each channel frame in order that the audio signal can be reconstructed. It would be understood that where in embodiments a different time-to-sparse domain transform or transformer is applied then the appropriate inverse transformer/transform is applied as the sparse-to-time domain transformer.

The application of the sparse-to-time domain transformer in the form of a IMDCT is shown in FIG. 10 by step 911.

The application of both the Inverse 2D Fourier Transformer 805 and the 3D Inverse Discrete Cosine Transformer 809 can be seen to be the second part of the operation whereby applying a series of Inverse Transforms recovers the sparse signal.

Then the individual frames can be combined to regenerate the audio signals for each channel.

The regeneration of the audio signal is shown in FIG. 10 by step 913.

Figure 13:
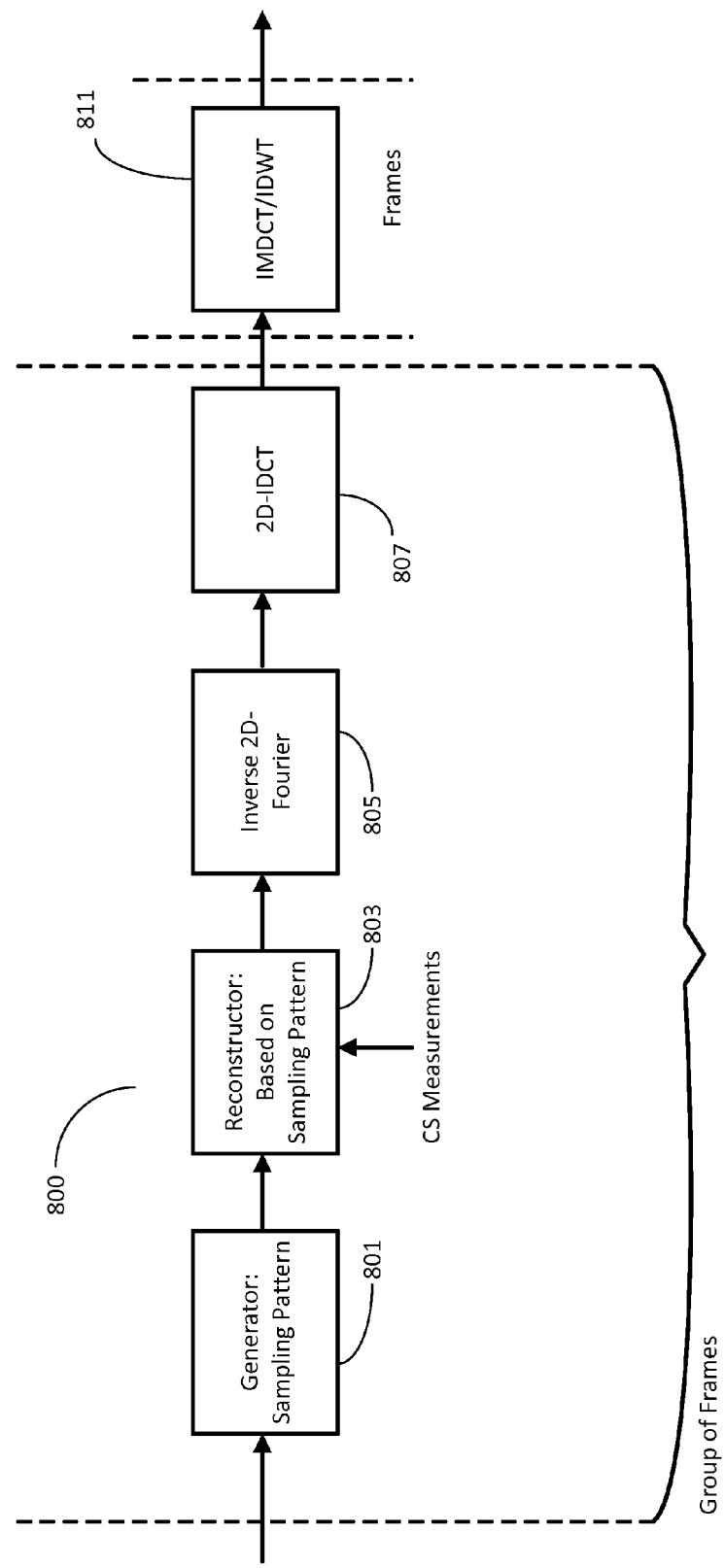
FIG. 13 shows schematically a further audio projector apparatus as shown in FIG. 4 according to some embodiments of the application.

With respect to FIG. 13, a single microphone or channel reconstruction is shown whereby the three dimensional IDCT is replaced by a two dimensional IDCT 807 as the single channel results in only a 2D DCT representation.

Although the above has been described with regards to audio signals, or audio-visual signals it would be appreciated that embodiments may also be applied to audio-video signals where the audio signal components of the recorded data are processed as described above and the video signal components may be synchronised using the above embodiments of the invention.

It shall be appreciated that the term user equipment is intended to cover any suitable type of wireless user equipment, such as mobile telephones, portable data processing devices or portable web browsers.

Furthermore elements of a public land mobile network (PLMN) may also comprise apparatus as described above.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Thus in summary there can be in at least one embodiment an apparatus comprising at least one processor and at least one memory including computer code, the at least one memory and the computer code configured to with the at least one processor cause the apparatus to at least perform: transforming an audio signal into a sparse domain signal, the sparse domain signal representing the audio signal; transforming the sparse domain signal into a measurement domain signal; determining a sampling pattern dependent on the measurement domain signal; and measuring the measurement domain signal dependent on the sampling pattern.

Similarly in at least one other embodiment there can comprise an apparatus comprising at least one processor and at least one memory including computer code, the at least one memory and the computer code configured to with the at least one processor cause the apparatus to at least perform: determining a measurement domain signal dependent on a sampling pattern and a measured measurement domain signal; transforming the measurement domain signal into a sparse domain signal; and transforming the sparse domain signal into an audio signal.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

Thus for example there can be a computer-readable medium encoded with instructions that, when executed by a computer perform: transforming an audio signal into a sparse domain signal, the sparse domain signal representing the audio signal; transforming the sparse domain signal into a measurement domain signal; determining a sampling pattern dependent on the measurement domain signal; and measuring the measurement domain signal dependent on the sampling pattern.

Furthermore there can be a computer-readable medium encoded with instructions that, when executed by a computer perform: determining a measurement domain signal dependent on a sampling pattern and a measured measurement domain signal; transforming the measurement domain signal into a sparse domain signal; and transforming the sparse domain signal into an audio signal.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. Apparatus comprising at least one processor and at least one memory including computer code, the at least one memory and the computer code configured to with the at least one processor cause the apparatus to at least perform:
   transforming, via a first domain transformation module implemented in the at least one memory, an audio signal into a sparse domain signal, the sparse domain signal representing the audio signal;
   transforming, via a second domain transformation module implemented in the at least one memory, the sparse domain signal into a measurement domain signal;
   determining, via a sampling pattern generation module implemented in the at least one memory, a sampling pattern dependent on the measurement domain signal, wherein determining the sampling pattern comprises:
      determining, via a main lobe generation module implemented in the at least one memory, a main lobe sampling pattern;
      determining, via a side lobe generation module implemented in the at least one memory, a side lobe sampling pattern;
      determining, via a vertical sampling generation module implemented in the at least one memory, a vertical sampling bar sampling pattern; and
      determining, via a star shaped sampling generation module implemented in the at least one memory, a star sampling pattern; and
   measuring, via a sparse measurement determination module implemented in the at least one memory, the measurement domain signal dependent on the sampling pattern.

2. The apparatus as claimed in claim 1, wherein transforming the audio signal into a sparse domain signal further causes the apparatus to perform at least one of: modified discrete cosine transforming the audio signal; and
   discrete wavelet transforming the audio signal.

3. The apparatus as claimed in claim 1, wherein transforming the sparse domain signal into a measurement domain signal further causes the apparatus to perform:
   a first transformation; and
   a further transformation comprising fourier transforming the first transformation, wherein the first transformation causes the apparatus to perform at least one of:
   discrete cosine transforming the sparse domain signal;
   discrete sine transforming the sparse domain signal; and
   Karhunen-Loeve transforming the sparse domain signal.

4. The apparatus as claimed in claim 3, wherein the audio signal comprises at least two channel audio signals, the sparse domain signal comprising at least two channel sparse domain signals each representing an associated channel audio signal, wherein transforming the first sparse domain signal into a first measurement domain signal further causes the apparatus to perform:
   aligning each channel sparse domain signal to form a three dimensional sparse domain signal;
   and three dimensional transforming of the three dimensional sparse domain signal.

5. The apparatus as claimed in claim 3, wherein fourier transforming on the first transformation causes the apparatus to perform two dimensional transforming on each channel of the first transformation.

6. The apparatus as claimed in claim 1, wherein determining a sampling pattern dependent on the measurement domain signal causes the apparatus to perform:
   combining the main lobe sampling pattern, the side lobe sampling pattern, the vertical sampling bar sampling pattern, and the star sampling pattern.

7. The apparatus as claimed in claim 6, wherein determining the main lobe sampling pattern causes the apparatus to perform determining a main lobe width, wherein the main lobe width is the width of one dimension of the measurement domain signal within which an average of signal energy envelope for the width is greater than a predefined value.

8. The apparatus as claimed in claim 7, wherein determining the vertical sampling bar sampling pattern causes the apparatus to perform determining a first bar sampling first dimension value adjacent to the main lobe width value; and
determining further bar sampling first dimension values by incrementing the first bar sampling first dimension value by a predefined function value.

9. The apparatus as claimed in claim 6, wherein determining the side lobe sampling pattern causes the apparatus to perform determining the width of one dimension of the measurement domain signal within which the signal energy envelope is greater than a second predefined value for at least one further dimension value of the measurement domain signal.

10. The apparatus as claimed in claim 6, wherein determining the star sampling pattern causes the apparatus to perform:
determining a plurality of radial sampling patterns; and
extracting a sub-part of the radial sampling patterns.

11. An apparatus comprising at least one processor and at least one memory including computer code, the at least one memory and the computer code configured to with the at least one processor cause the apparatus to at least perform:
determining, via a sparse measurement determination module implemented in the at least one memory, a measurement domain signal dependent on a sampling pattern and a measured measurement domain signal, wherein determining the measurement domain signal comprises:
determining, via a main lobe generation module implemented in the at least one memory, a main lobe sampling pattern;
determining, via a side lobe generation module implemented in the at least one memory, a side lobe sampling pattern;
determining, via a vertical sampling generation module implemented in the at least one memory, a vertical sampling bar sampling pattern; and
determining, via a star shaped sampling generation module implemented in the at least one memory, a star sampling pattern;
transforming, via a reconstruction module implemented in the at least one memory, the measurement domain signal into a sparse domain signal; and
transforming, via the reconstruction module implemented in the at least one memory, the sparse domain signal into an audio signal.

12. The apparatus as claimed in claim 11, wherein transforming the sparse domain signal into an audio signal further causes the apparatus to perform at least one of:
inverse modified discrete cosine transforming the audio signal; and inverse discrete wavelet transforming the audio signal.

13. The apparatus as claimed in claim 11, wherein transforming the measurement domain signal into the sparse domain signal further causes the apparatus to perform:
a first transformation causing the apparatus to perform fourier transforming on the measurement domain signal; and
a further transformation causing the apparatus to perform at least one of;
inverse discrete cosine transforming the first transformation;
inverse discrete sine transforming the first transformation; and
inverse Karhunen-Loeve transforming the first transformation.

14. The apparatus as claimed in claim 13, wherein fourier transforming on the first transformation causes the apparatus to perform two dimensional transforming on each channel of the measurement domain signal.

15. The apparatus as claimed in claim 11, further caused to perform:
combining the main lobe sampling pattern, the side lobe sampling pattern, the vertical sampling bar sampling pattern, and the star sampling pattern to form the sampling pattern.

16. The apparatus as claimed in claim 15 wherein determining the vertical sampling bar sampling pattern causes the apparatus to perform determining a first bar sampling first dimension value adjacent to a main lobe sampling pattern width value; and determining further bar sampling first dimension values by incrementing the first bar sampling first dimension value by a predefined function value.

17. The apparatus as claimed in claim 15, wherein determining the star sampling pattern causes the apparatus to perform:
determining a plurality of radial sampling patterns; and
extracting a sub-part of the radial sampling patterns.

18. A method comprising:
transforming an audio signal into a sparse domain signal, the sparse domain signal representing the audio signal;
transforming the sparse domain signal into a measurement domain signal;
determining, via a sampling pattern generation module implemented in the at least one memory, a sampling pattern dependent on the measurement domain signal, wherein determining the sampling pattern comprises:
determining, via a main lobe generation module implemented in the at least one memory, a main lobe sampling pattern;
determining, via a side lobe generation module implemented in the at least one memory, a side lobe sampling pattern;
determining, via a vertical sampling generation module implemented in the at least one memory, a vertical sampling bar sampling pattern; and
determining, via a star shaped sampling generation module implemented in the at least one memory, a star sampling pattern; and
measuring, via a sparse measurement determination module implemented in the at least one memory, the measurement domain signal dependent on the sampling pattern.

19. The method as claimed in claim 18, wherein transforming the audio signal into a sparse domain signal comprises at least one of:
modified discrete cosine transforming the audio signal; and
discrete wavelet transforming the audio signal.

20. The method as claimed in claim 18, wherein transforming the sparse domain signal into a measurement domain signal comprises:
a first transformation; and
a further transformation comprising fourier transforming the first transformation, wherein first transformation comprises at least one of:
discrete cosine transforming the sparse domain signal;
discrete sine transforming the sparse domain signal; and
Karhunen-Loeve transforming the sparse domain signal.

21. The method as claimed in claim 20, wherein the audio signal comprises at least two channel audio signals, the sparse domain signal comprising at least two channel sparse domain signals each representing an associated channel audio signal, wherein transforming the first sparse domain signal into a first measurement domain signal comprises:
aligning each channel sparse domain signal to form a three dimensional sparse domain signal; and three dimensional transforming of the three dimensional sparse domain signal.

22. The method as claimed in claim 20, wherein fourier transforming on the first transformation comprises two dimensional transforming on each channel of the first transformation.

23. The method as claimed in claim 18, wherein determining a sampling pattern dependent on the measurement domain signal comprises:
combining the main lobe sampling pattern, the side lobe sampling pattern, the vertical sampling bar sampling pattern, and the star sampling pattern.

24. The method as claimed in claim 23, wherein determining the main lobe sampling pattern comprises determining a main lobe width, wherein the main lobe width is the width of one dimension of the measurement domain signal within which an average of signal energy envelope for the width is greater than a predefined value.

25. The method as claimed in claim 24, wherein determining the vertical sampling bar sampling pattern comprises determining a first bar sampling first dimension value adjacent to the main lobe width value; and determining further bar sampling first dimension values by incrementing the first bar sampling first dimension value by a predefined function value.

26. The method as claimed in claim 23, wherein determining the side lobe sampling pattern comprises determining the width of one dimension of the measurement domain signal within which the signal energy envelope is greater than a second predefined value for at least one further dimension value of the measurement domain signal.

27. The method as claimed in claim 23, wherein determining the star sampling pattern comprises:
determining a plurality of radial sampling patterns; and
extracting a sub-part of the radial sampling patterns.

28. A method comprising:
determining, via a sparse measurement determination module implemented in the at least one memory, a measurement domain signal dependent on a sampling pattern and a measured measurement domain signal, wherein determining the measurement domain signal comprises:
determining, via a main lobe generation module implemented in the at least one memory, a main lobe sampling pattern;
determining, via a side lobe generation module implemented in the at least one memory, a side lobe sampling pattern;
determining, via a vertical sampling generation module implemented in the at least one memory, a vertical sampling bar sampling pattern; and
determining, via a star shaped sampling generation module implemented in the at least one memory, a star sampling pattern;
transforming, via a reconstruction module implemented in the at least one memory, the measurement domain signal into a sparse domain signal; and
transforming, via the reconstruction module implemented in the at least one memory, the sparse domain signal into an audio signal.

29. The method as claimed in claim 28, wherein transforming the sparse domain signal into an audio signal comprises at least one of:
inverse modified discrete cosine transforming the audio signal; and
inverse discrete wavelet transforming the audio signal.

30. The method as claimed in claim 28, wherein transforming the measurement domain signal into the sparse domain signal comprises:
a first transformation comprising fourier transforming on the measurement domain signal; and
a further transformation comprising at least one of:
inverse discrete cosine transforming the first transformation;
inverse discrete sine transforming the first transformation; and
inverse Karhunen-Loeve transforming the first transformation.

31. The method as claimed in claim 30, wherein fourier transforming on the first transformation comprises two dimensional transforming on each channel of the measurement domain signal.

32. The method as claimed in claim 28, further comprising:
combining the main lobe sampling pattern, the side lobe sampling pattern, the vertical sampling bar sampling pattern, and the star sampling pattern to form the sampling pattern.

33. The method as claimed in claim 32 wherein determining the vertical sampling bar sampling pattern comprises determining a first bar sampling first dimension value adjacent to a main lobe sampling pattern width value; and determining further bar sampling first dimension values by incrementing the first bar sampling first dimension value by a predefined function value.

34. The method as claimed in claim 32, wherein determining the star sampling pattern comprises:
determining a plurality of radial sampling patterns; and
extracting a sub-part of the radial sampling patterns.

* * * * *